United States Patent
Li et al.

(10) Patent No.: US 10,088,865 B1
(45) Date of Patent: Oct. 2, 2018

(54) MODULAR COMPUTING SYSTEM

(71) Applicant: Amazon Technologies, Inc., Seattle, WA (US)

(72) Inventors: Christopher Thomas Li, Mountain View, CA (US); Gregory Turner Witmer, Mountain View, CA (US); Prachi Avinash Pant, San Mateo, CA (US); Bryan Dan Trinh, San Jose, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 369 days.

(21) Appl. No.: 14/534,618

(22) Filed: Nov. 6, 2014

(51) Int. Cl.
*G06F 1/16* (2006.01)
*H05K 1/18* (2006.01)

(52) U.S. Cl.
CPC .......... *G06F 1/1626* (2013.01); *G06F 1/1635* (2013.01); *G06F 1/1652* (2013.01); *G06F 1/1698* (2013.01); *H05K 1/189* (2013.01); *H05K 2201/10128* (2013.01)

(58) Field of Classification Search
CPC ........ G06F 1/1632; G06F 1/16; G06F 1/1622; G06F 1/1626; G06F 1/1635; G06F 1/1652; G06F 1/1698; H04B 1/3833; H04B 1/3888; A45C 2011/002; H04M 1/18; H04M 1/0214; H04M 1/0254; H04M 1/0262; H04M 1/0283; H05K 1/189; H05K 2201/10128
USPC ... 361/679.3, 679.41–679.44, 79.55, 689.56; 455/575.1, 575.8
See application file for complete search history.

(56) References Cited

U.S. PATENT DOCUMENTS

| 5,973,677 | A  | * | 10/1999 | Gibbons | G06F 1/1626 178/18.04 |
| 6,819,549 | B1 | * | 11/2004 | Lammers-Meis | G06F 1/1626 361/679.55 |
| 7,612,997 | B1 | * | 11/2009 | Diebel | G06F 1/1632 361/679.41 |
| 9,077,013 | B2 | * | 7/2015 | Huang | H01M 2/1022 |
| 9,319,501 | B2 | * | 4/2016 | Huang | H04M 1/0283 |
| 2008/0055258 | A1 | * | 3/2008 | Sauers | G06F 1/1626 345/173 |
| 2009/0219676 | A1 | * | 9/2009 | Murakata | H05K 5/0086 361/679.01 |
| 2009/0245565 | A1 | * | 10/2009 | Mittleman | H04M 1/035 381/365 |
| 2009/0272639 | A1 | * | 11/2009 | Mittleman | H01H 13/79 200/345 |
| 2009/0314400 | A1 | * | 12/2009 | Liu | A45C 11/00 150/165 |

(Continued)

*Primary Examiner* — Steven T Sawyer
*Assistant Examiner* — Sagar Shrestha
(74) *Attorney, Agent, or Firm* — K&L Gates LLP

(57) ABSTRACT

A modular computing system includes an electronic device and a case. The electronic device has a cavity formed by a thin portion and a thick portion. The case has an auxiliary portion that fits within the cavity of the electronic device when the electronic device is docked with the case. The electronic device has a device battery and the auxiliary portion of the case has a case battery that electronically couples with the electronic device when the electronic device is coupled to the case. The electronic device has a display assembly coupled to a cover glass, and the cover glass has two apertures providing two respective buttons within the apertures.

18 Claims, 27 Drawing Sheets

(56) References Cited

U.S. PATENT DOCUMENTS

| | | | |
|---|---|---|---|
| 2010/0048268 A1* | 2/2010 | O'Neill | H04B 1/3888 455/575.8 |
| 2010/0124040 A1* | 5/2010 | Diebel | G06F 1/1628 361/816 |
| 2011/0064349 A1* | 3/2011 | Braun | F16C 33/4635 384/572 |
| 2012/0287562 A1* | 11/2012 | Wu | G06F 1/1626 361/679.01 |
| 2013/0017865 A1* | 1/2013 | Allore | H01Q 1/243 455/566 |
| 2013/0057785 A1* | 3/2013 | Hiratomo | H04M 1/0202 348/843 |
| 2013/0083257 A1* | 4/2013 | Murakami | G06F 1/18 348/839 |
| 2013/0088431 A1 | 4/2013 | Ballagas et al. | |
| 2013/0106353 A1* | 5/2013 | Foster | H02J 7/0044 320/114 |
| 2013/0165190 A1* | 6/2013 | Ko | H05K 5/03 455/575.8 |
| 2013/0235521 A1* | 9/2013 | Burch | G06F 1/1635 361/679.48 |
| 2013/0257712 A1* | 10/2013 | Imamura | H01Q 1/243 345/156 |
| 2014/0099526 A1* | 4/2014 | Powell | H01M 2/1066 429/100 |
| 2014/0185234 A1* | 7/2014 | Lee | H04M 1/0249 361/679.56 |
| 2014/0253024 A1* | 9/2014 | Rautiainen | H02J 7/025 320/108 |
| 2015/0365508 A1* | 12/2015 | Kwon | H04B 1/3888 455/566 |
| 2016/0282905 A1* | 9/2016 | Laine | G06F 1/1632 |

* cited by examiner

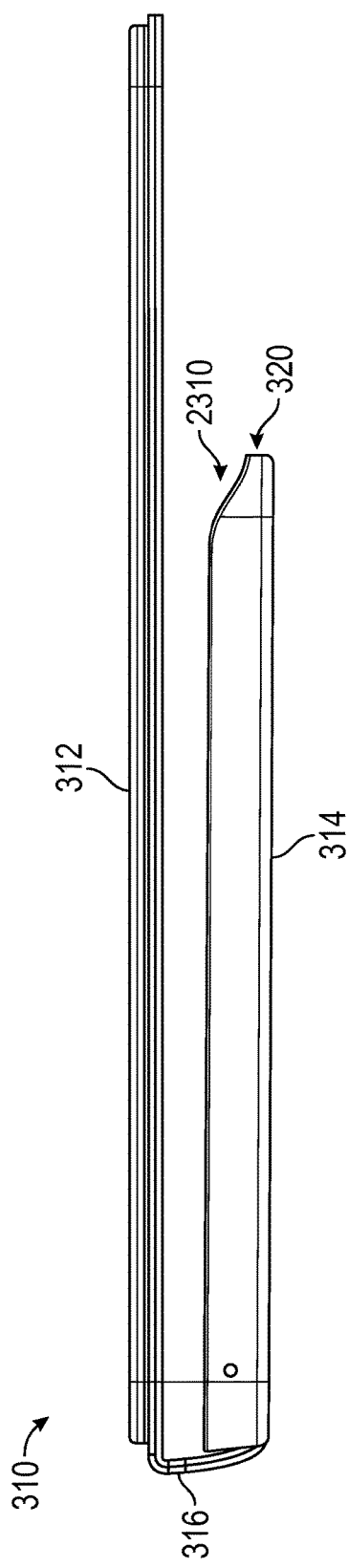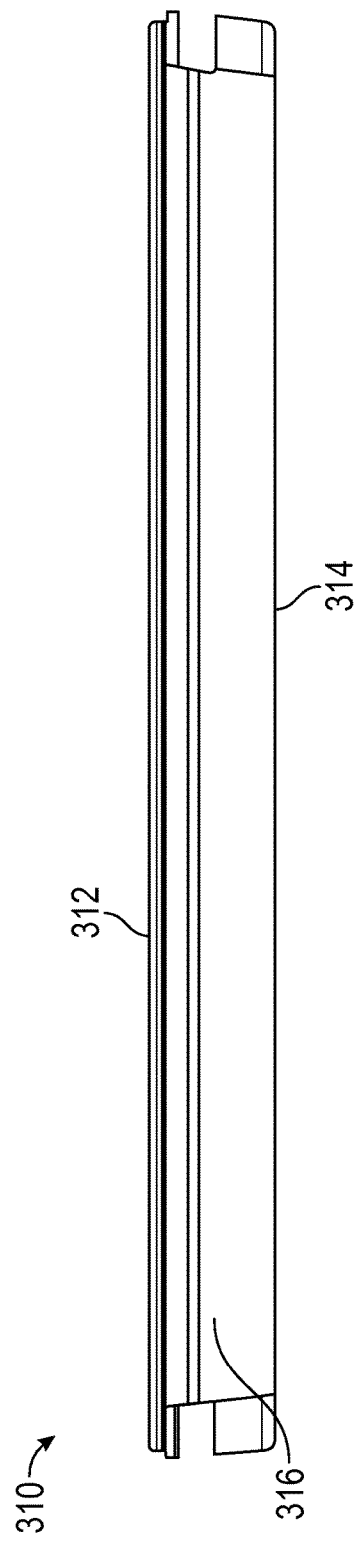
FIG. 23
FIG. 24

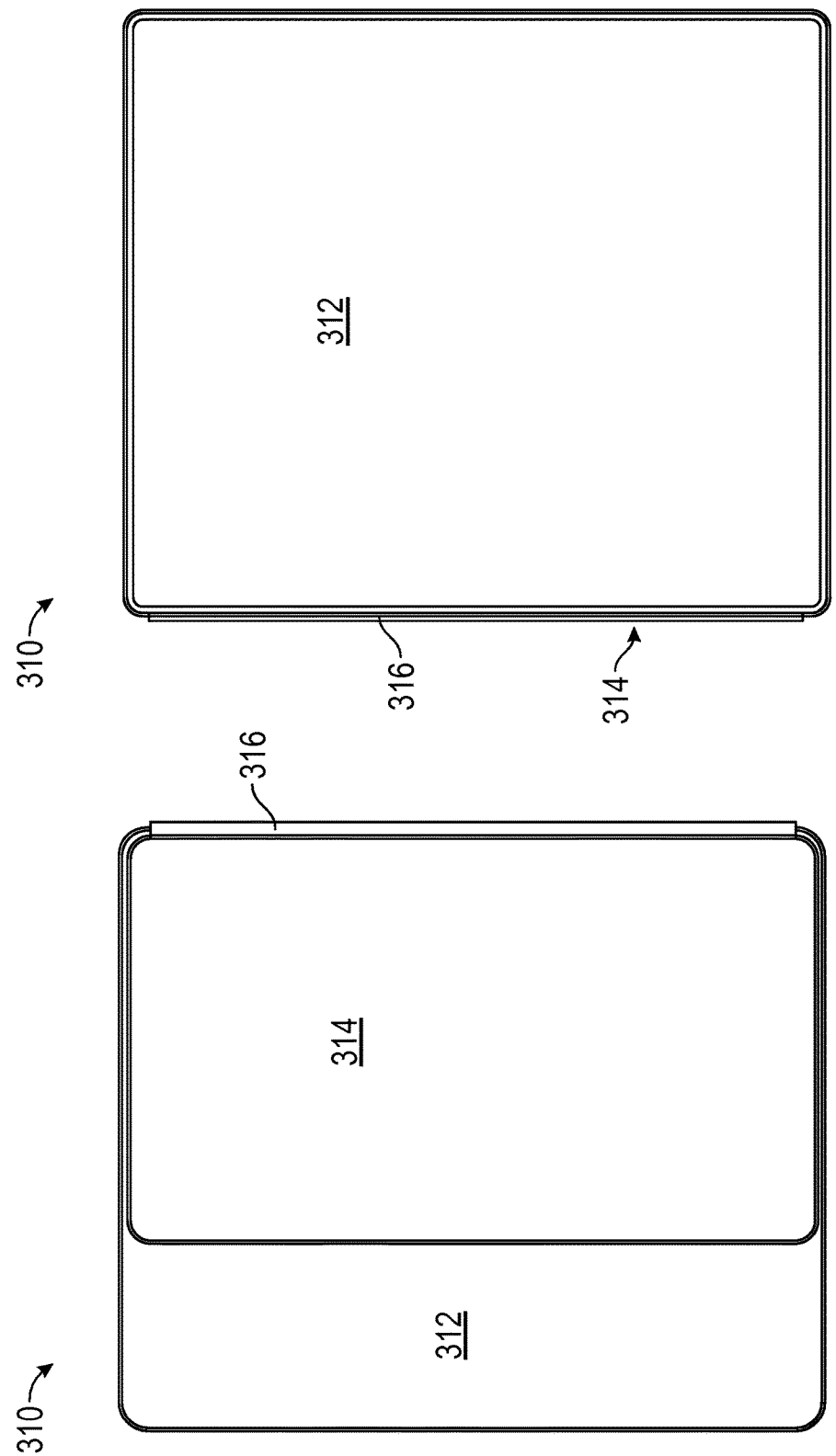

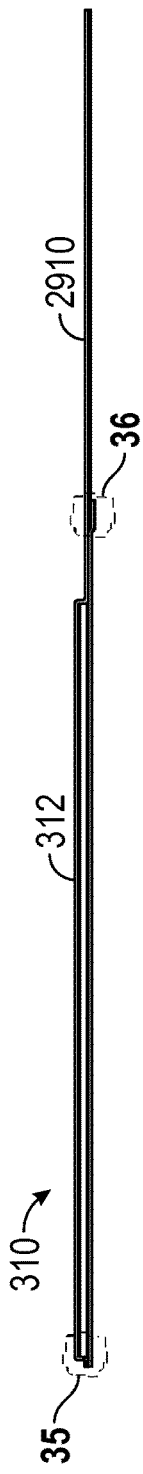
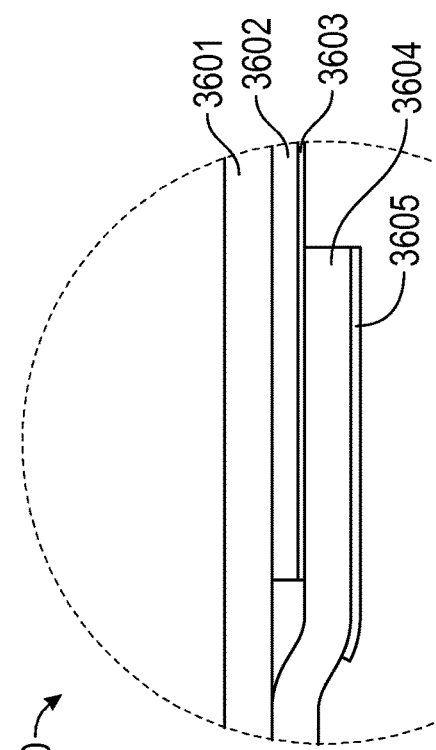
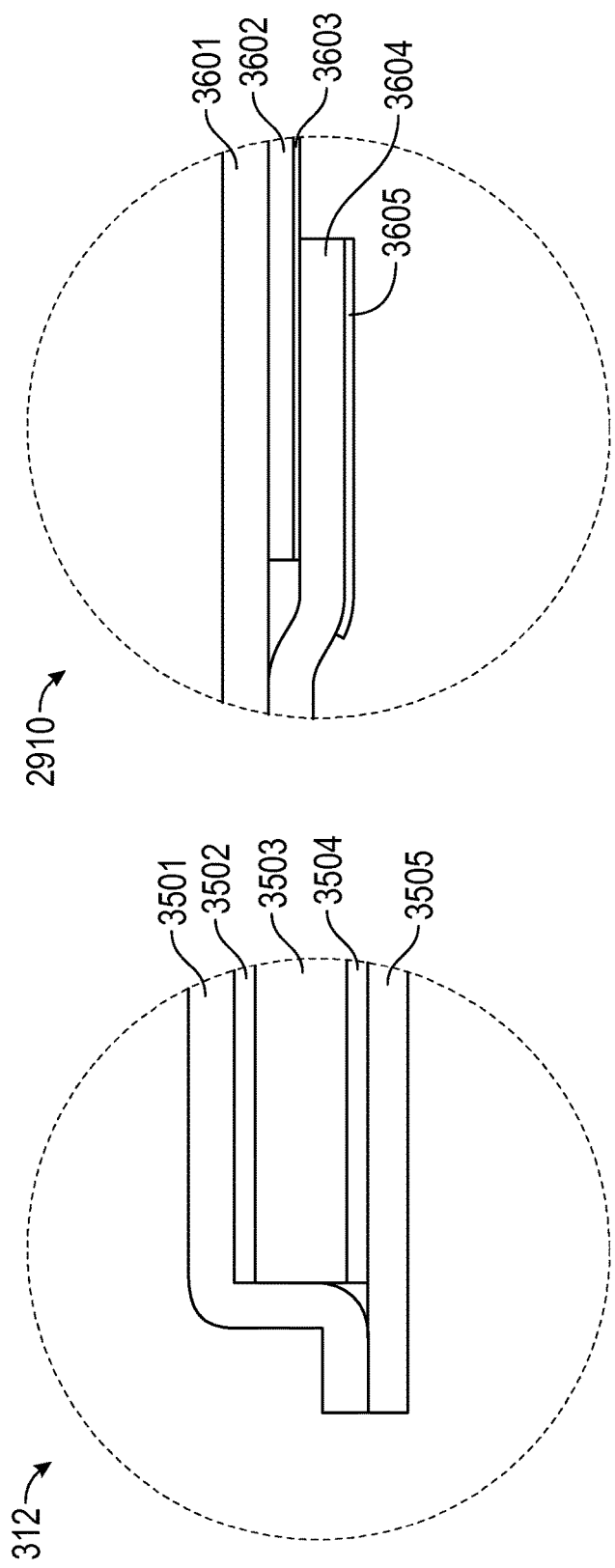

MODULAR COMPUTING SYSTEM

BACKGROUND

Portable electronic devices, such as e-book readers or tablet computers, have become increasingly popular recently. One constraint on usability for portable electronic devices is their limited battery life, which requires that users recharge the device frequently after some period of usage. For e-book readers in particular, such as those with electronic paper displays (EPDs), it is desirable to provide extended battery life. Many users of e-book readers expect to go many days, weeks, or months on a single charge. However, reduced weight is also a highly desirable feature for portable electronic devices, particularly e-book readers which in typical usage may be held by the user for hours at a time. As a result, increasing the size of the battery to improve battery life has the undesirable effect of increasing the weight of the device. Accordingly, there is a need for improved electronic devices which can provide strong battery life while minimizing overall device weight.

BRIEF DESCRIPTION OF DRAWINGS

FIG. 23 illustrates a bottom side view of a case, in accordance with embodiments of the present invention.

FIG. 24 illustrates a hinge side view of a case, in accordance with embodiments of the present invention.

FIG. 25 illustrates a back view of a case, in accordance with embodiments of the present invention.

FIG. 26 illustrates a front view of a case, in accordance with embodiments of the present invention.

FIG. 34 illustrates a cross-sectional view of a portion of a case, in accordance with embodiments of the present invention.

FIG. 35 illustrates a cross-sectional view of a portion of a case, in accordance with embodiments of the present invention.

FIG. 36 illustrates a cross-sectional view of a portion of a case, in accordance with embodiments of the present invention.

DETAILED DESCRIPTION

In the following description, reference is made to the accompanying drawings which illustrate several embodiments of the present disclosure. It is to be understood that other embodiments may be utilized and system or process changes may be made without departing from the spirit and scope of the present disclosure. The following detailed description is not to be taken in a limiting sense, and the scope of the embodiments of the present invention is defined only by the claims of the issued patent. It is to be understood that drawings are not necessarily drawn to scale.

In accordance with aspects of the present invention, an electronic device, such as an electronic book (e-book) reader, may have a thin portion corresponding to a portion of a display assembly and a thick portion corresponding to another portion of the display assembly and other components of the e-book reader such as page turn buttons and a battery module. The thick portion may be along one side of the e-book reader, making the e-book reader easier to hold within a user's hand grip. Furthermore, because the thin portion is relatively light in comparison to the thick portion, the weight of the e-book reader may be better balanced within a user's hand because the majority of the weight is in line with the user's hand grip. To reduce weight of the e-book reader, a smaller capacity battery may be utilized, such as a device battery with a recharging need of about one week. To increase the time between recharging, an e-book reader case having a case battery and a lid may be docked with the e-book reader. The case battery may be a larger capacity battery than the e-book reader battery, having a recharging need of about six weeks. When the e-book reader is undocked from the case, the user may continue reading the e-book reader without the added weight of the case.

Figure 1:
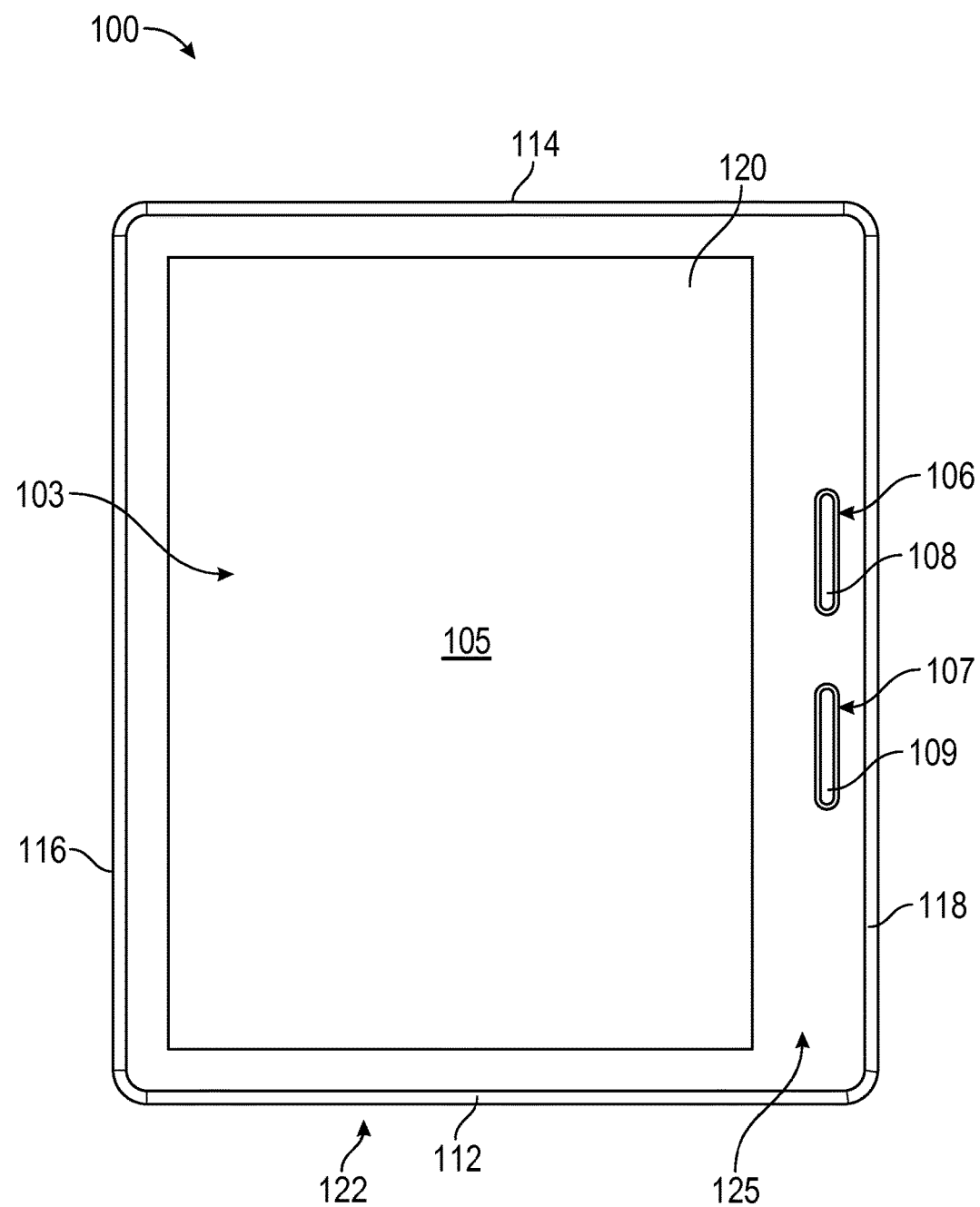
FIG. 1 illustrates a front view of an electronic device, in accordance with embodiments of the present invention.

FIG. 1 illustrates a front view of an electronic device 100, in accordance with embodiments of the present invention. The electronic device 100 comprises a display assembly 103 coupled to a cover glass 105 through which images produced by the display assembly 103 may be viewed by a user. In some embodiments, the display assembly 103 may comprise a six inch, 300 dots per inch (DPI) electronic-ink (e-ink) display. The cover glass 105 may provide a protective exterior front surface of the electronic device 100, and may comprise a high strength glass, such as alkali-aluminosilicate glass, commonly used for portable touch screen computing devices. In some embodiments, a display mask 125 may be adhered to the underside of the cover glass 105 to hide from a user's view the components of the electronic device 100 that are underneath the display mask 125. As illustrated in FIG. 1, the display mask may hide certain components beneath portions of the cover glass 105, while allowing the images of the display assembly 103 to be viewable. The electronic device 100 may comprise a bottom side portion 112, a top side portion 114, a thin side portion 116, a thick side portion 118, a front portion 120, and a back portion 122. It is to be understood that references to positions of the electronic device 100, such as top and bottom, are for illustrative purposes, and are not to be considered limiting.

The electronic device 100 may comprise a first button 108 and a second button 109 which may be actuated by a user to, for example, turn a page of an electronic book. The cover glass 105 may comprise a first aperture 106 and a second aperture 107 within which the first button 108 and the second button 109 respectively reside. It is to be understood that the electronic device 100 may have no buttons, one button, or more than two buttons. In the embodiment illustrated in FIG. 1, the symmetric design of the page turn buttons may be advantageous to allow a user to hold the electronic device 100 with the right hand, and based on the screen orientation, the second button 109 may be depressed by the thumb of the user to turn to a next page of a book, and the first button 108 may be depressed by the thumb of the user to turn to a previous page of the book. Furthermore, if the device is rotated by a user to be held in the left hand, then based on the screen orientation, the first button 108 may be depressed to turn to a next page of the book and the second button 109 may be depressed to turn to a previous page of the book.

Figure 2:
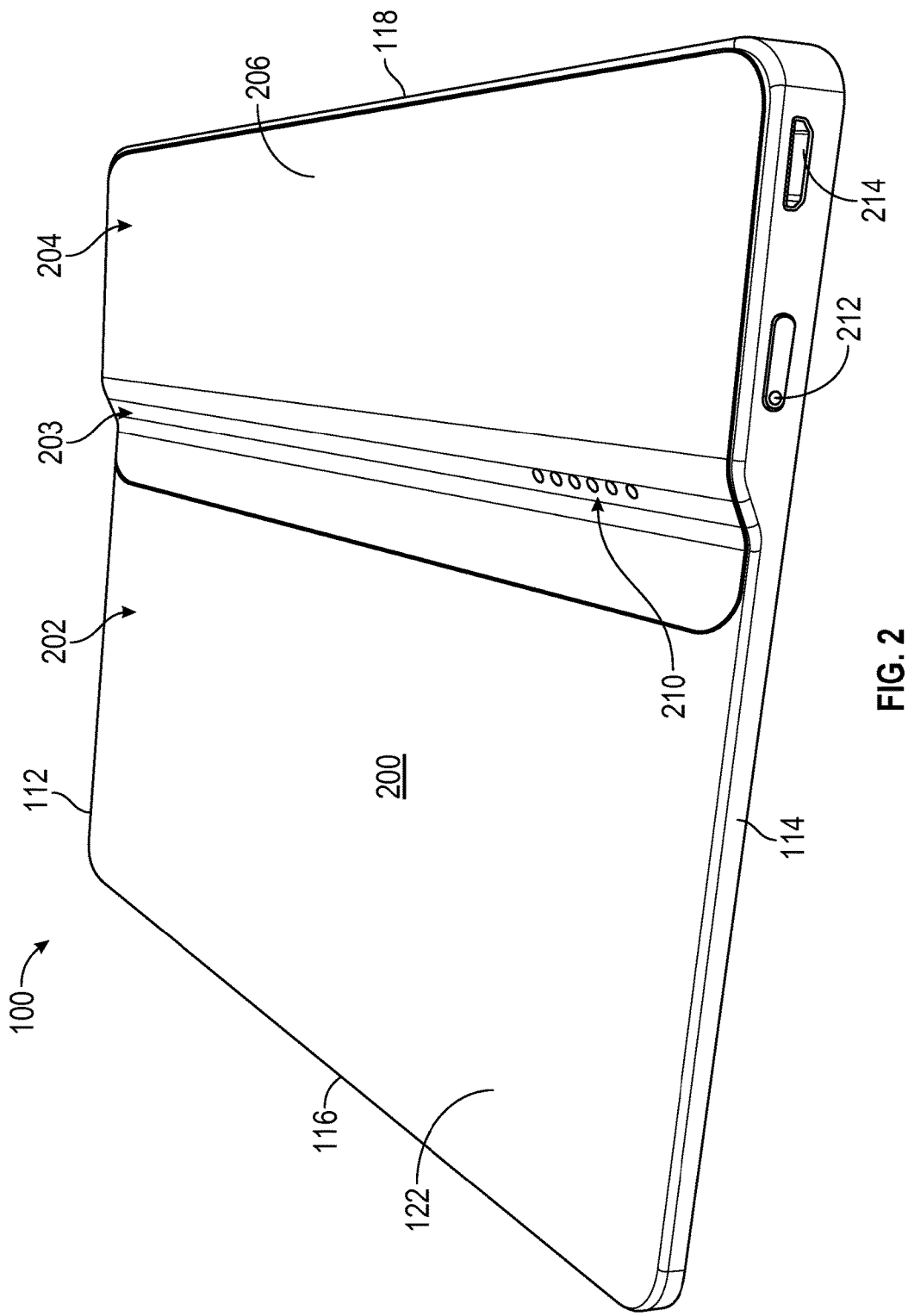
FIG. 2 illustrates a perspective back view of an electronic device, in accordance with embodiments of the present invention.

FIG. 2 illustrates a perspective back view of an electronic device 100, in accordance with embodiments of the present invention. The electronic device 100 comprises a frame 200 having a thin portion 202, a thick portion 204, and a transition portion 203 between the thin portion 202 and the thick portion 204. Under some embodiments the transition portion 203 may have a slope of less than 90 degrees, for example about 30 degrees, reflecting the transition from the thick portion 204 to the thin portion 202. In some embodiments, the transition portion 203 has a 90 degree angle in relation to the thick portion 204 and the thin portion 202. The thick portion 204 may house certain components of the electronic device 100, such as components related to a device connector module 210 or a first connector module, a switch module 212 such as a power button, or a port module 214 such as a universal serial bus (USB). Such placement of certain components in the thick portion 204 may be advantageous for comfort of holding the electronic device in one hand, such that the hand may more comfortably grip the thick portion 204. Furthermore, the weight of the thick portion 204 may provide better balance for holding the electronic device 100 with one hand. It is to be understood that a component that is housed in the thick portion 204 may have portions of the component that are also housed in the transition portion 203. For example, as illustrated in FIG. 2, contacts of the device connector module 210 may be located in the transition portion 203, while other portions of the device connector module 210 may be located in the thick portion 204. It is to be further understood that a component that is housed in the thin portion 202 may have portions of the component that are also housed in the thick portion 204. For example, a portion of the display assembly 103 may be located in the thick portion 204.

A removable cap 206 may be coupled to the frame 200 to cover all or a portion of the components housed in the thick portion 206. As illustrated in FIG. 2, the removable cap 206 may also extend over a portion of the transition portion 203 or the thin portion 202. The removable cap 206 may comprise a material such as plastic, plastic with bonded sheet metal, or the like. It is to be understood that the thin portion 202 may have a width that is approximately two thirds the width of the electronic device 100, and the thick portion 204 may have a width that is approximately one third the width of the electronic device 100. Such widths, however, are examples, and are not meant to be limiting. Similarly, the extent to which the removable cap 206 extends over the thin portion 202, if at all, is an example and not meant to be limiting. The removable cap 206 may be advantageous to allow access to components for reworking or maintenance.

As illustrated in FIG. 2, the removable cap 206 may have one or more apertures to expose exterior portions of certain components, such as exterior portions of the device connector module 210. The removable cap 206 may be advantageous in that it can be removed and provide access to certain components housed beneath the removable cap 206. An exterior surface portion of the frame 200 may have a hard-coat painted surface. An exterior surface portion of the removable cap 206 may have a soft-touch painted surface. Furthermore, the switch module 212 may comprise an integrated sign-of-life indicator, such as a light-emitting diode (LED).

Figure 3:
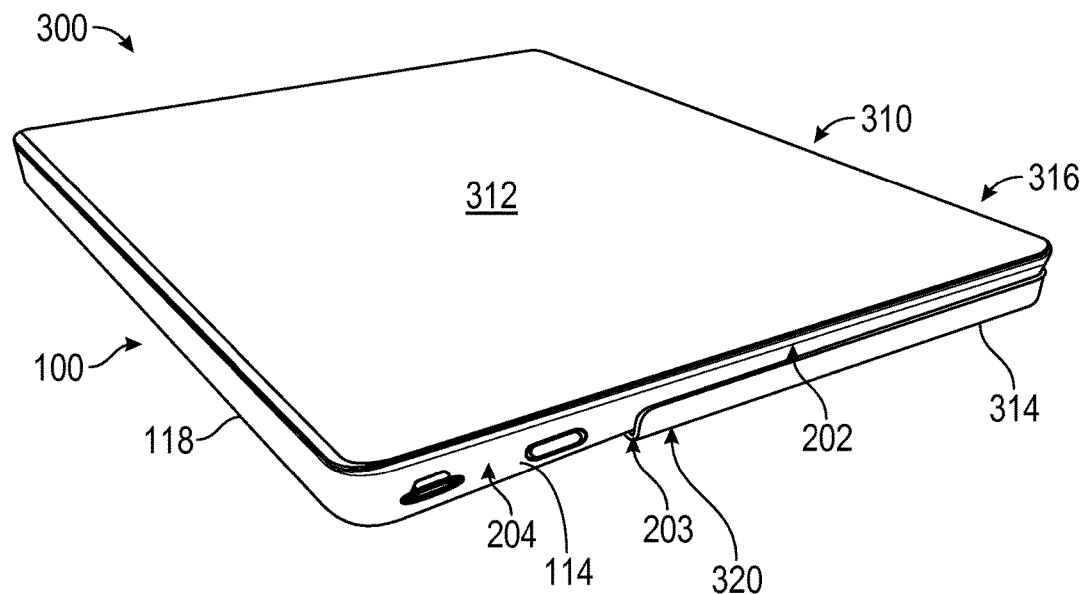
FIG. 3 illustrates a perspective front view of a system comprising an electronic device and a case, in accordance with embodiments of the present invention.

FIG. 3 illustrates a perspective front view of a system 300 comprising an electronic device 100 and a case 310 docked to the electronic device 100, in accordance with embodiments of the present invention. The case 310 or accessory may comprise a lid 312, an auxiliary portion 314, and a hinge 316 coupled with the lid 312 and the auxiliary portion 314. In some embodiments, the auxiliary portion 314 may have a width that is greater than half the total width of the frame. Although not shown, the auxiliary portion 314 may house a case battery module 2930 or a second battery module, which may be electronically coupled to the electronic device via the device connector module 210. The case battery module 2930 may be advantageous to extend the time for which the electronic device 100 may remain turned on. The thin portion 202 and the thick portion 204 of the frame 200 may form a cavity, and the auxiliary portion 314 may be configured to fit within the cavity. The auxiliary portion 314 may be configured to fit proximate the exterior of the thin portion 202, which may cause the system to have a generally or relatively uniform thickness between the front and the back of the system 300. Furthermore, an end of the auxiliary portion may have a sloping end 320 that is comparable to the slope of the exterior of the transition portion 203.

The lid 312 or display cover may be positioned over the cover glass 105, which may protect the cover glass 105 from scratches or other damage. The hinge 316 may allow the lid 312 to rotate or fold away from the cover glass 105, which may be advantageous for a user to hold the system 300 similar to how one would hold a book. The hinge 316 may also allow the lid 312 to rotate or fold over, such that the lid 312 may be positioned proximate the auxiliary portion 314.

Figure 4:
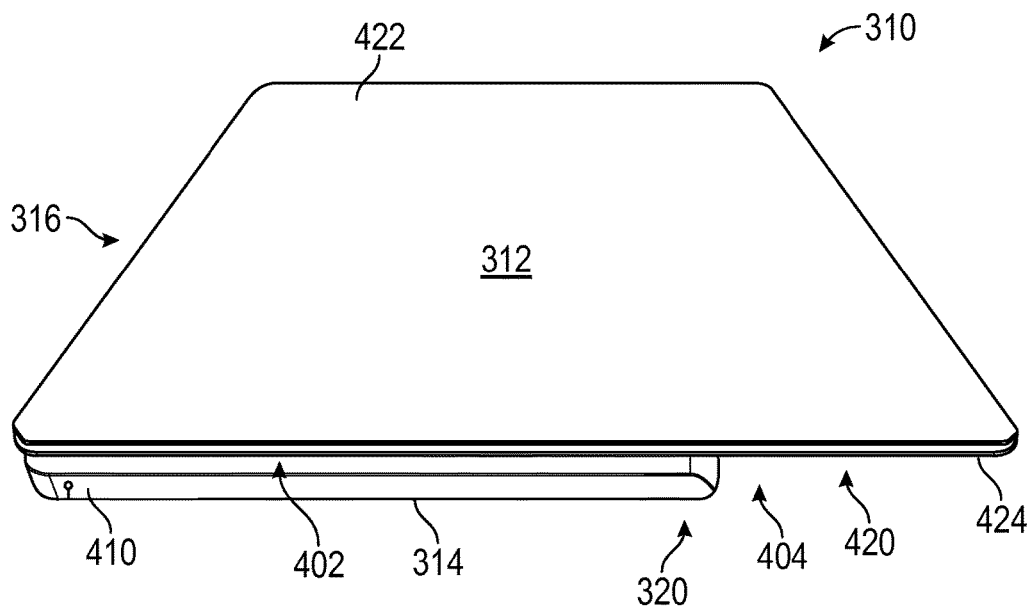
FIG. 4 illustrates a perspective front view of a case, in accordance with embodiments of the present invention.

FIG. 4 illustrates a perspective front view of a case 310, in accordance with embodiments of the present invention. As illustrated in FIG. 4, the case 310 is not docked to an electronic device 100. There is a thin portion area 402 between the lid 312 and the auxiliary portion 314 wherein all or some of the thin portion 202 of a docked electronic device 100 may reside. Also, there is a thick portion area 404 underneath the lid 312 and adjacent the auxiliary portion 314 wherein all or some of the thick portion 204 of the docked electronic device 100 may reside. Furthermore, the auxiliary portion 314 may have a sloping end 320 that corresponds to the transition portion 203 of the docked electronic device 100. The auxiliary portion 314 may include a case indicator 410, such as a sign-of-life indicator, that may comprise an LED or the like. Also, an exterior surface of the auxiliary portion 314 may have a hard-coat painted surface The lid 312 has an interior surface portion 420 that may be positioned proximate the cover glass 105 when the case 310 is docked to the electronic device 100. At least some of the interior surface portion 420 may comprise a material or fabric such as microsuede, microfiber, or the like. The lid 312 may have an exterior surface portion 422 that is opposing the interior surface 420. At least some of the exterior surface portion 422 may comprise a material or fabric such as leather, faux leather, or the like. The lid may have an edge surface portion 424 between the interior surface portion 420 and the exterior surface portion 422. The edge surface portion 424 may comprise a pressed or sewn coupling of the materials or fabrics of the interior surface portion 420 and the exterior surface portion 422.

Figure 5:
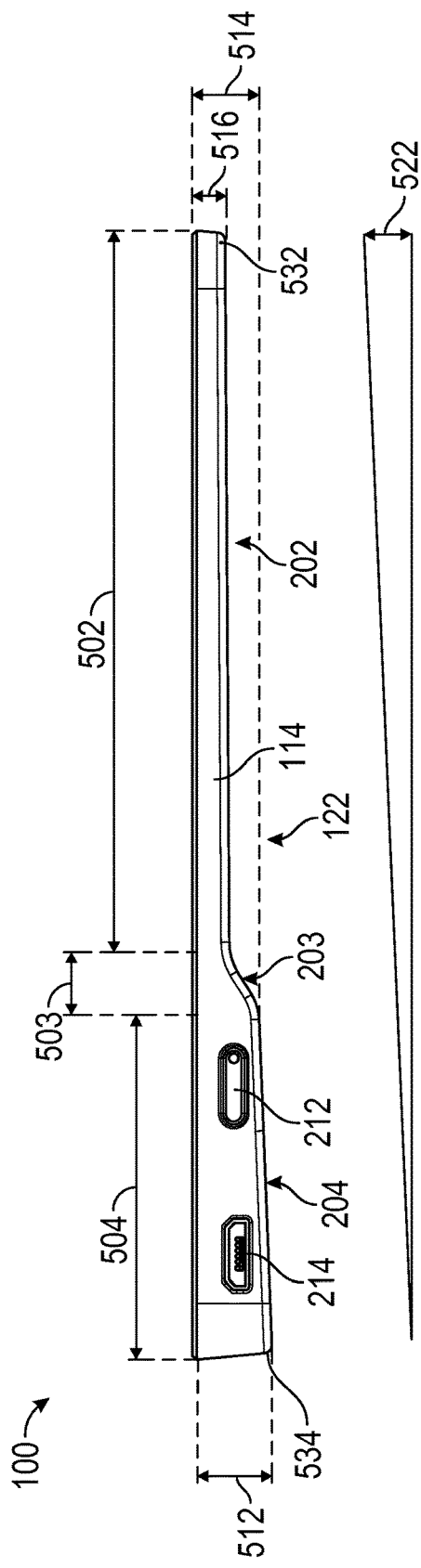
FIG. 5 illustrates a top side view of an electronic device, in accordance with embodiments of the present invention.

FIG. 5 illustrates a top side view of an electronic device 100, in accordance with embodiments of the present invention. When viewing the top side portion 114, the thin portion 202 may have a thin portion width 502, the thick portion 204 may have a thick portion width 504, and the transition portion 203 may have a transition portion width 503. When viewing the top side portion 144, a first thick portion height 512 may be greater than a second thick portion height 514, such that the bottom portion 122 corresponding to the thick portion width 504 may have a taper or slope 522, for example, of 2.5 degrees. Under some embodiments, the thick portion 204 has a tapered or sloped surface having an angle 522 corresponding to the angle from an outside edge 534 of the thick portion to an opposing outside edge 532 of the thin portion. Such may be advantageous, for example, to keep the electronic device 100 stable or free from wobbles when the electronic device 100 is placed on a flat surface, such as a table top. For example, when the device is positioned in this way, the back portion 122 corresponding to the thick portion 204 may lay flush on the table, and the opposing end of the thin portion 202 may rest against the table. Such may provide improved support for a user to depress the first button 108 or the second button 109, and may reduce shifting of the device in relation to the table during such button depression.

Example dimensions of the electronic device 100 may include a first thick portion height 512 of about 8.56 mm, a second thick portion height 514 of about 5.95 mm, a thin portion height 516 of about 3.55 mm, a thick portion width 504 of about 39 mm, a transition portion width 503 of about 5 mm, and a thin portion width 502 of about 78 mm.

Figure 6:
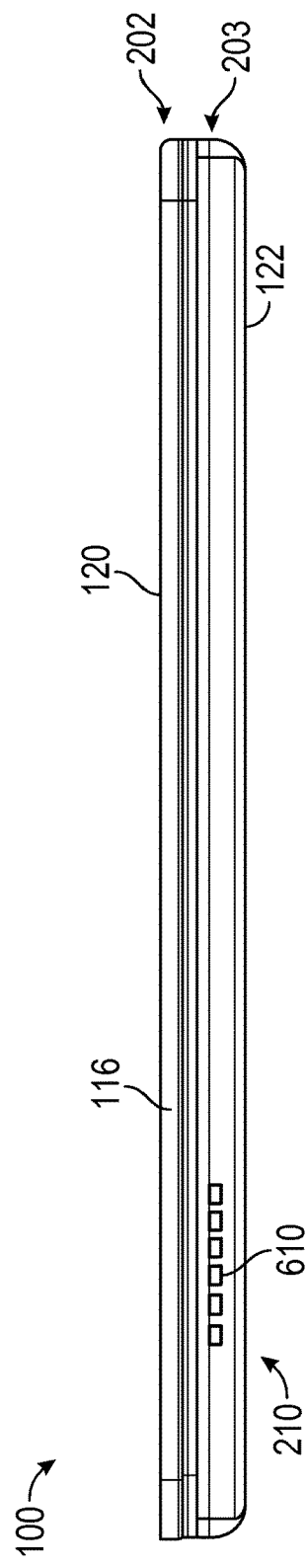
FIG. 6 illustrates a thin side view of an electronic device, in accordance with embodiments of the present invention.

FIG. 6 illustrates a thin side view of an electronic device 100, in accordance with embodiments of the present invention. When viewing the thin side portion 116, with the front portion 120 above and the back portion 122 below, then the thin portion 202 is visible above the transition portion 203. Furthermore, in some embodiments, the device connector module 210 is also visible, as it may be positioned on a surface of the transition portion 203. In some embodiments, a device connector module 210 may include an interface comprising at least one contact 610. Although six contacts 610 are depicted in FIG. 6, the number of contacts is not meant to be limiting.

Figure 7:
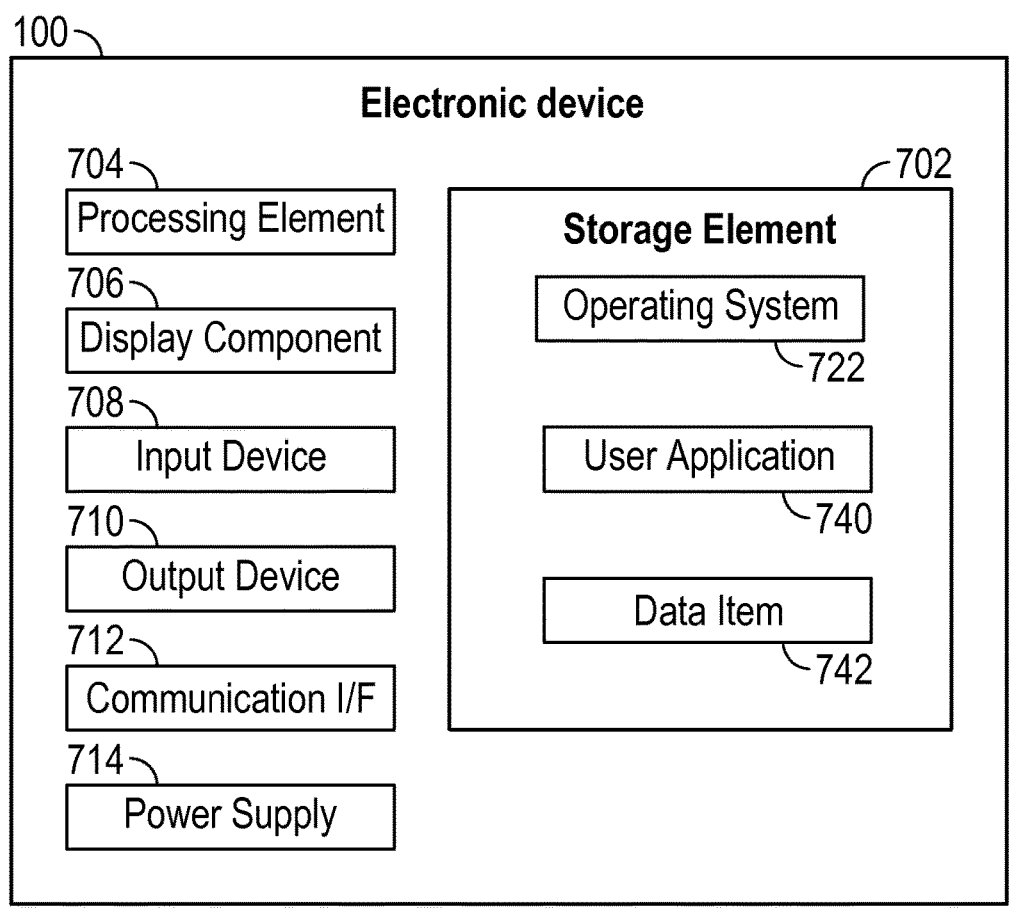
FIG. 7 illustrates an example block diagram of an electronic device, in accordance with embodiments of the present invention.

FIG. 7 illustrates an example block diagram of an electronic device 100, in accordance with embodiments of the present invention. The electronic device 100 may be implemented as any of a number of electronic devices, such as an e-book reader, a tablet computing device, a smartphone, a media player, a portable gaming device, a portable digital assistant, a laptop computer, a desktop computer, and other devices providing media presentation functionality. It should be understood that various types of computing devices including a processing element, a memory, and a user interface for receiving user input can be used in accordance with various embodiments discussed herein.

The electronic device 100 may include a display component 706. The display component 706 may comprise, for example, one or more devices such as cathode ray tubes (CRTs), liquid crystal display (LCD) screens, gas plasma-based flat panel displays, LCD projectors, or other types of display devices, etc. The electronic device 100 may include one or more input devices 708 operable to receive inputs from a user. The input devices 708 can include, for example, a push button, touch pad, touch screen, wheel, joystick, keyboard, mouse, trackball, keypad, accelerometer, light gun, game controller, or any other such device or element whereby a user can provide inputs to the electronic device 100. These input devices 708 may be incorporated into the electronic device 100 or operably coupled to the electronic device 100 via wired or wireless interface. For computing devices with touch sensitive displays, the input devices 708 can include a touch sensor that operates in conjunction with the display component 706 to permit users to interact with the image displayed by the display component 706 using touch inputs (e.g., with a finger or stylus). The electronic device 100 may also include an output device 710, such as one or more audio speakers.

The electronic device 100 may also include at least one communication interface 712 comprising one or more wireless components operable to communicate with one or more separate devices within a communication range of the particular wireless protocol. The wireless protocol can be any appropriate protocol used to enable devices to communicate wirelessly, such as Bluetooth, cellular, IEEE 802.11, or infrared communications protocols, such as an IrDA-compliant protocol. It should be understood that the electronic device 100 may also include one or more wired communications interfaces for coupling and communicating with other devices, such as a USB port. The electronic device 100 may also include a power supply 714, such as, for example, a rechargeable battery operable to be recharged through conventional plug-in approaches, or through other approaches such as capacitive charging.

The electronic device 100 may also include a processing element 704 for executing instructions and retrieving data stored in a storage element 702 or memory. As would be apparent to one of ordinary skill in the art, the storage element 702 can include one or more different types of memory, data storage or computer-readable storage media, such as, for example, a first data storage for program instructions for execution by the processing element 704, and a second data storage for images or data and/or a removable storage for transferring data to other devices. The storage element 702 may store software for execution by the processing element 704, such as, for example, operating system software 722 and user applications 740. The storage element 702 may also store a data item 742, such as, for example, data files corresponding to one or more applications 740.

Figure 8:
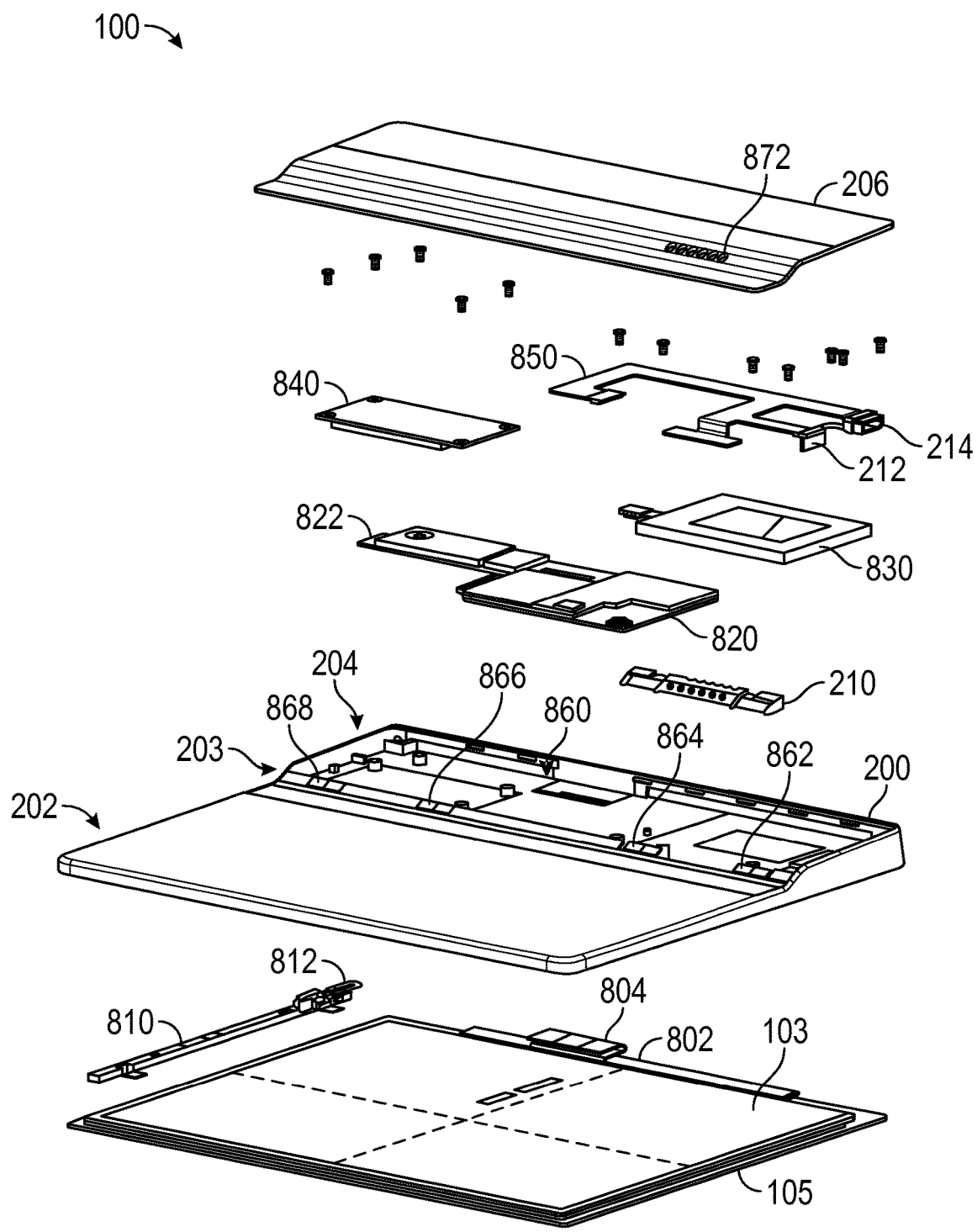
FIG. 8 illustrates an exploded back view of an electronic device, in accordance with embodiments of the present invention.

FIG. 8 illustrates an exploded back view of an electronic device 100, in accordance with embodiments of the present invention. In the embodiment shown, the electronic device 100 may include the display assembly 103 coupled to the cover glass 105. A button assembly 802 may be coupled to the display assembly 103 and the cover glass 105, and the button assembly may have an integrated display flexible printed circuit (FPC) 804. The electronic device 100 may include a wide area network (WAN) antenna module 810 with an antenna cable 812 or co-axial cable. Under some embodiments, the WAN antenna module 810 may extend across the thick portion 204, the transition portion 203, and the thin portion 203. Furthermore, the antenna cable 812 may be provided in the thick portion 204.

The electronic device 100 may include the frame 200 having a first device magnet 862, a second device magnet 864, a third device magnet 866 and a fourth device magnet 868. Although four device magnets are depicted, it is to be understood that the number of magnets is not meant to be limiting. The frame 200 may include a grip recess region 860 or a second recess region configured to carry the device connector module 210, a mainboard module 820 having a wireless local area network (WLAN) antenna 822 or a Wi-Fi antenna, a device battery module 830 or a first battery module, a radio such as a WAN modem module 840, and a connector FPC 850 having the switch module 212 and the port module 214. The grip recess region 860 may be enclosed or covered with a removable cap 206 having one or more contact holes 872. Under some embodiments, the grip recess region may be positioned in the thick portion.

Figure 9:
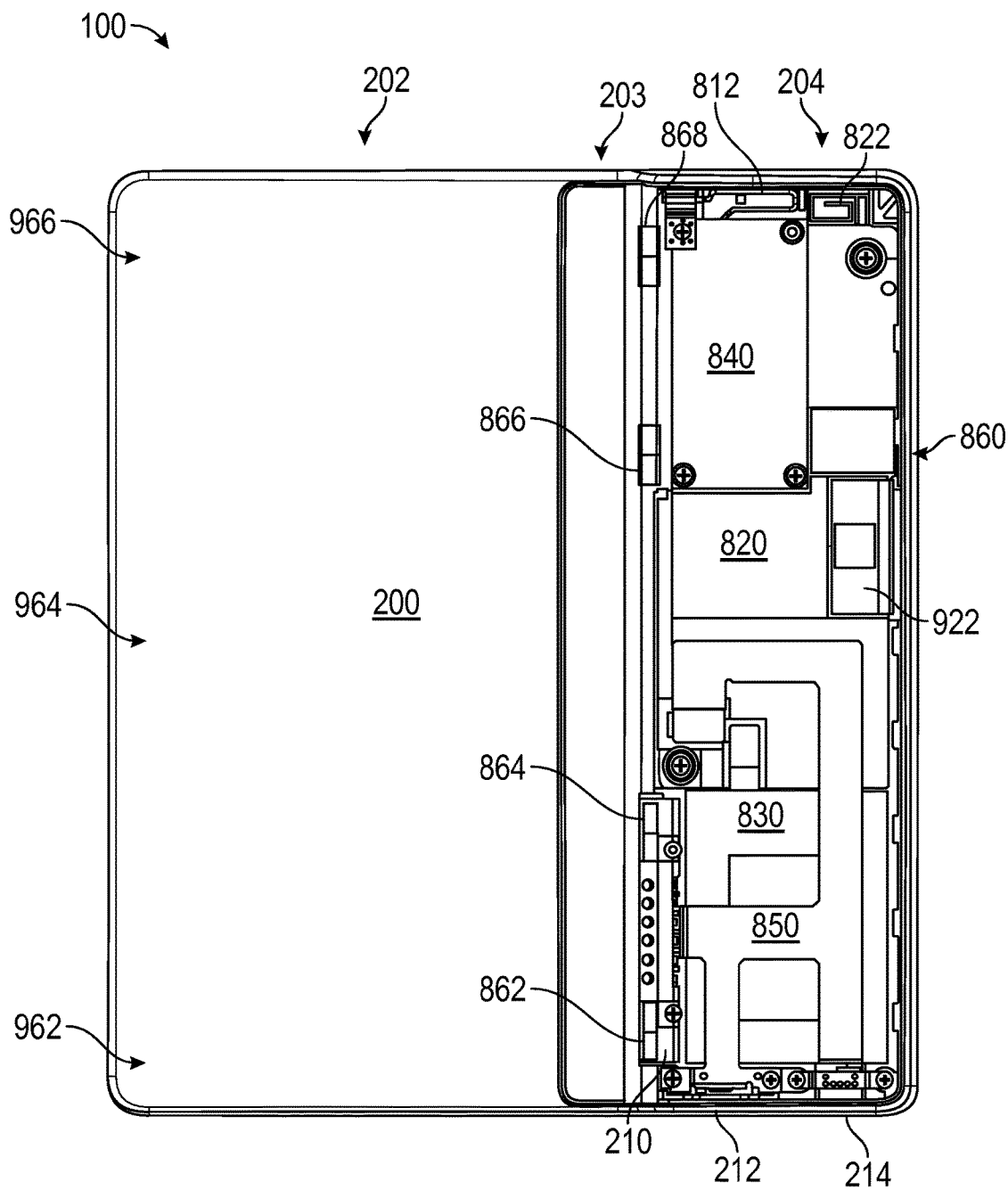
FIG. 9 illustrates a back view of an electronic device, in accordance with embodiments of the present invention.

FIG. 9 illustrates a back view of an electronic device 100 in which the removable cap 206 is not coupled to the frame 200, in accordance with embodiments of the present invention. As illustrated, the grip recess region 860 carries the device connector module 210, the mainboard module 820, the device battery module 830, the WAN modem module 840, and the connector FPC 850. In the embodiment shown, the antenna cable 812 of the WAN antenna module 810 is located in the grip recess region 860 in order to couple with the WAN modem module 840, and the WAN antenna module 810 and the WLAN antenna 822 may be positioned to share the same antenna window of the electronic device 100. In some embodiments, the mainboard module includes an integrated display connector 922 of the integrated display FPC 804, to which the mainboard module 820 may couple. As illustrated, the first device magnet 862, the second device magnet 864, the third device magnet 866, and the fourth device magnet 868 may be positioned in the transition area 203 of the electronic device 100. Although not visible in FIG. 9, in some embodiments, the frame 200 may include a fifth device magnet 962, a sixth device magnet 964, and a seventh device magnet 966. Such magnets may be provided in the thin portion 202 of the electronic device 100.

Figure 10:
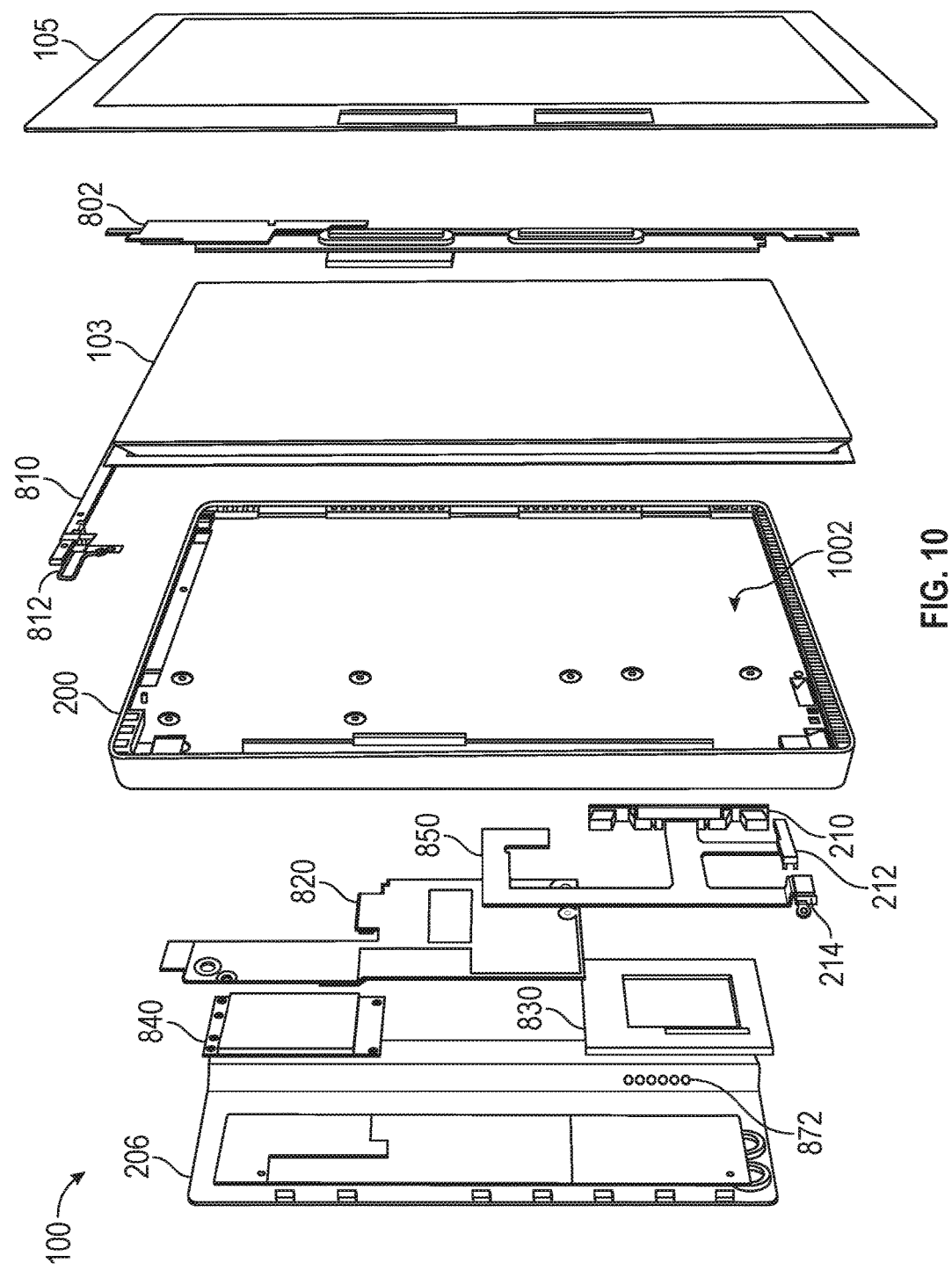
FIG. 10 illustrates an exploded front view of an electronic device, in accordance with embodiments of the present invention.

FIG. 10 illustrates an exploded front view of an electronic device 100, in accordance with embodiments of the present invention. In the embodiment shown, the electronic device 100 may include the frame 200 having a display recess region 1002 or first recess region configured to carry the display assembly 103, the WAN antenna module 810, and the button assembly 802. Under some embodiments, the cover glass 105 may cover or enclose the components provided in the display recess region 1002. A space may be provided underneath the cover glass between the top edge of the display recess region 1002 and the display assembly 103, and the WAN antenna module 810 may be placed within the space. The electronic device 100 may also include the connector FPC 850, the mainboard module 820, the device battery module 830, and the WAN modem module 840, which may be positioned in the grip recess region 860, and covered with the removable cap 206.

Figure 11:
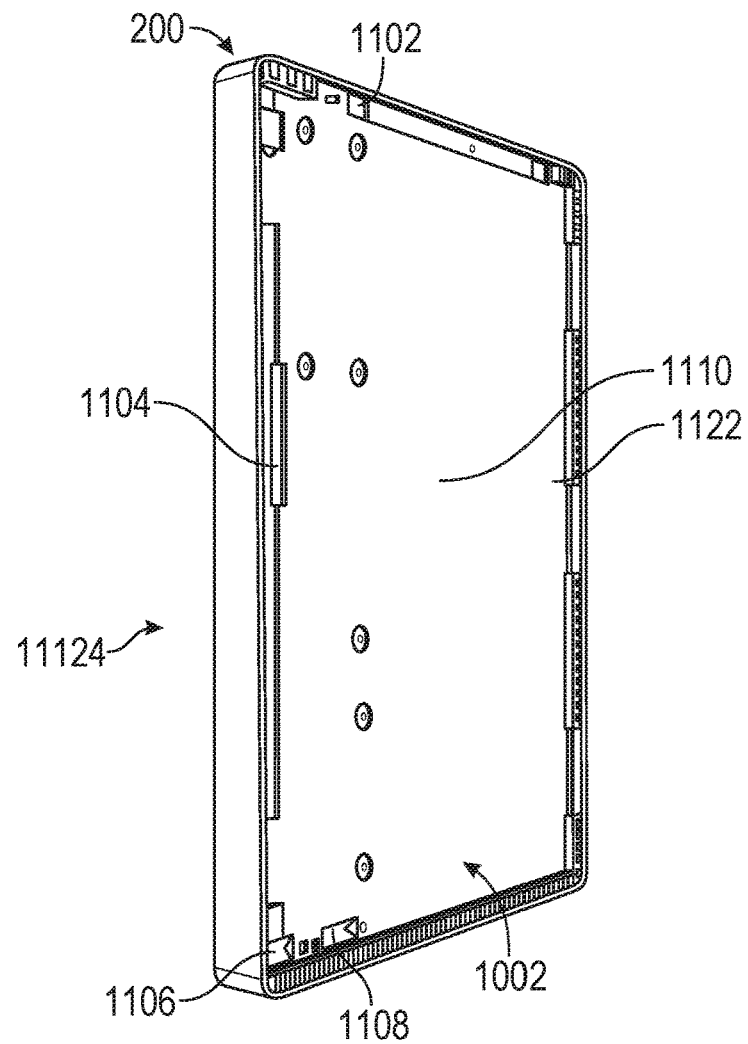
FIG. 11 illustrates a perspective front view of a frame, in accordance with embodiments of the present invention.

FIG. 11 illustrates a perspective front view of a frame 200, in accordance with embodiments of the present invention. The frame 200 may have a front side 1122 and a back side 1124. Under some embodiments, the surface of the frame 200 corresponding to the display recess region 002 may be coupled or adhered to the display module 103. Such may be advantageous when the display module 103 includes touch capabilities, and touches that press against the display module 103 may be less likely to cause damage due to the support of the surface of the frame 200 corresponding to the display recess region 1002. An example of damage that may be prevented is a crack of the glass substrate of an EPD.

The frame 200 may include a WAN antenna aperture 1102 through which a portion of the WAN antenna module 810 may pass, for example, the antenna cable 812. The frame 200 may further include a display FPC aperture 1104 through which the integrated display FPC 804 may pass, such as to couple with the mainboard module 820. The frame 200 may further include a switch aperture 1106 in which the switch module 212 may reside, and may further include a port aperture 1108 in which the port module 214 may reside. In some embodiments, the above apertures are placed on a respective edge of the display recess region 1002, which may be advantageous to prevent the above apertures from serving as stress points of the display assembly 103.

The inner surface of the frame 200, such as a portion of the surface of the display recess region 1002, may comprise a metal plating 1110, a conductive nickel plating, or the like that is plated on top of a base plastic material or the like. Under some embodiments, the metal plating 1110 may be electroplated with electroplating technology. The metal plating 1110 may serve as a grounding layer, may block radiofrequencies, or may provide structural support. A base plastic material that is plated with the metal plating 1110 may be advantageous in comparison to a base metal material because the plated base plastic material may be lighter yet may still be structurally rigid. Such rigid plating may provide a back plane to which the display assembly 103 may be bonded. Under some embodiments, the outer edge of the cover glass 105 may also be bonded to the outer edge of the frame 200, which may reduce the leakage of light at the outer edge of the cover glass 105.

Figure 12:
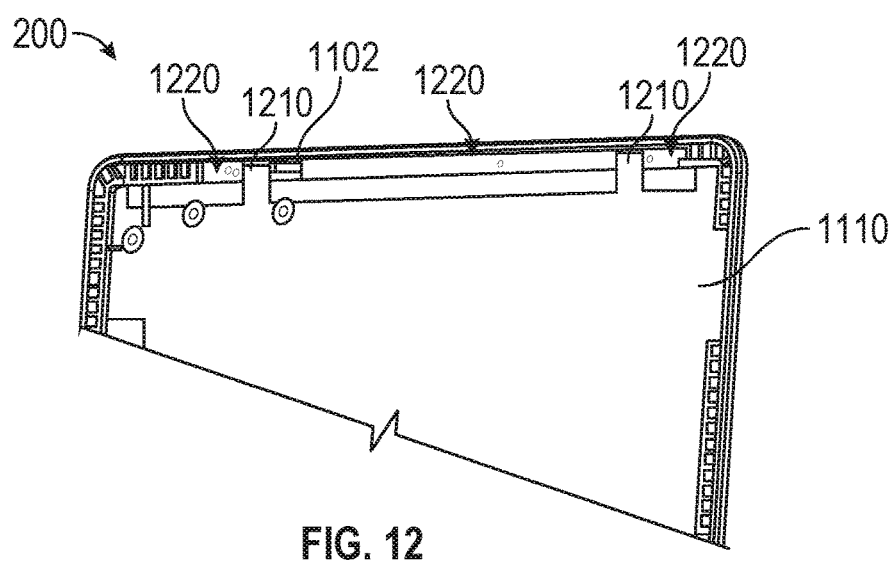
FIG. 12 illustrates a front view of a portion of a frame, in accordance with embodiments of the present invention.

Under some embodiments, an antenna window can be defined by not plating certain areas of the base plastic material. Such an antenna window of nonconductive material, such as plastic, may improve wireless radiofrequency (RF) communication transmissions for the electronic device 100. For example, an antenna placed in an antenna window of nonconductive material has reduced shielding compared to an antenna placed within a conductive housing, such as a high-conductivity metal. An antenna within an antenna window may have improved transmission and reception capabilities due to a distance, clearance or separation from conductive elements of the electronic device 100, such as the metal plating 1110. In some embodiments, when the metal plating 1110 is acting as a grounding plane, the grounding plane has less shielding effect on the antenna resonating elements of an antenna located within a portion of the electronic device 100 comprising an antenna window. Accordingly, by creating an antenna window as shown in FIG. 12, the need for joining plastic to a metal material is reduced, and correspondingly, weak joints that join metal material and plastic material are reduced. Examples of a metal plating 1110 are nanocrystalline metal or Nanovate metal from Integran Technologies Inc. of Mississauga, Canada. In some embodiments, the metal plating 1110 may have a thickness of about 0.03 mm.

FIG. 12 illustrates a front view of a portion of a frame 200, in accordance with embodiments of the present invention. The frame 200 may include grounding tabs 1210 or peninsulas, which may be an extension of the metal plating 1110 and may provide grounding for the WAN antenna module 810. Adjacent the grounding tabs 1202 may be unplated areas 1220 that provide antenna windows for the WAN antenna module 810 or the WLAN antenna 822. The unplated areas 1220, which may comprise nonconductive material, may be advantageous to reduce interference with the radiation of the WAN antenna module 810.

Figure 13:
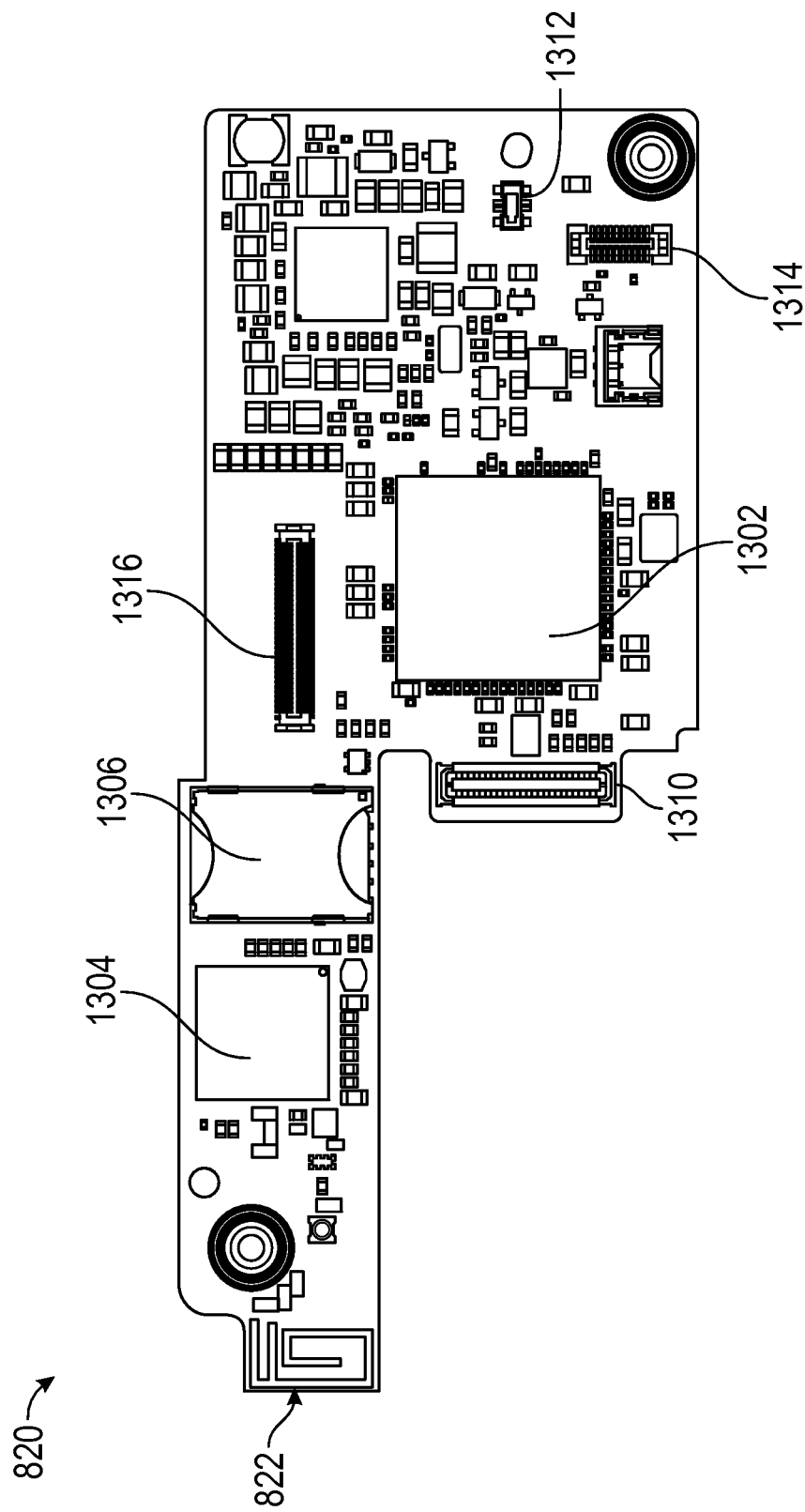
FIG. 13 illustrates a mainboard module, in accordance with embodiments of the present invention.

FIG. 13 illustrates a mainboard module 820, in accordance with embodiments of the present invention. The mainboard module 820 may include a multichip module 1302 or a system on a chip (SOC). The multichip module 1302 may comprise a central processing unit (CPU) coupled to a miniaturized PCB, and the miniaturized PCB may route signals to random access memory such as dynamic random access memory (DRAM), and flash memory such as an embedded multimedia card (eMMC). In some embodiments, the random access memory and the flash memory may be integrated into a multichip package. Under some embodiments, the multichip module 1302 may include solder balls or the like to couple to the mainboard module 820.

The mainboard module 820 may include a radio such as a WLAN processor 1304 and the WLAN antenna 822. For example, the WLAN antenna 822 may be an antenna on a chip, such as having antenna traces on the mainboard module 820. The WLAN antenna 822 may be positioned proximate the WAN antenna module 810. Such may be advantageous because the WLAN antenna 822 and the WAN antenna module 810 may share the same antenna window, as described above. The mainboard module 820 may include a WAN card reader 1306, which may carry a WAN smart card, such as a Nano Subscriber Identity Module (SIM) Card, and may include a WAN modem socket 1310, which may couple to the WAN modem module 840. The mainboard module 802 may also include an integrated display socket 1316 to couple to the integrated display connector 922 of the integrated display FPC 804, a battery socket 1312 to couple to the device battery module 830, or a connector socket 1314 to couple to the connector FPC 850.

Figure 14:
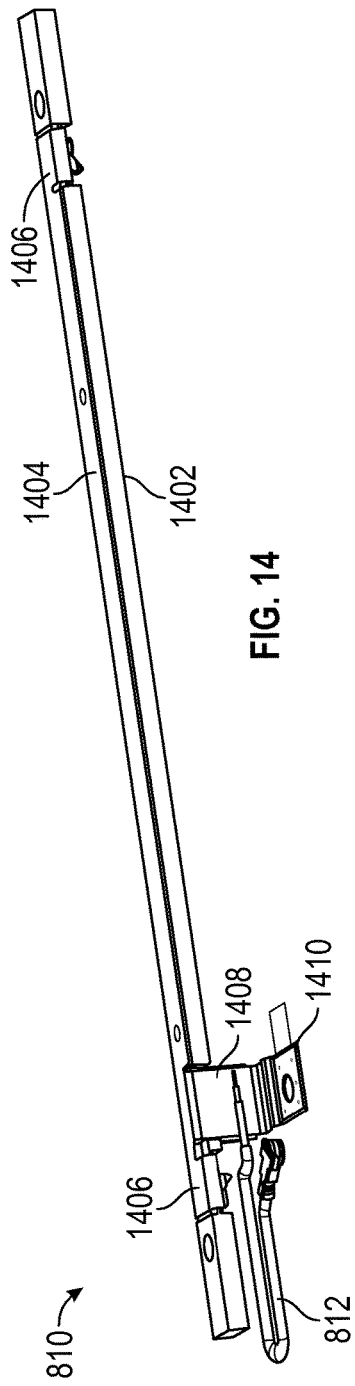
FIG. 14 illustrates a perspective view of a WAN antenna module, in accordance with embodiments of the present invention.

FIG. 14 illustrates a perspective view of a WAN antenna module 810, in accordance with embodiments of the present invention. The WAN antenna module 810 includes an antenna carrier 1402 coupled to an antenna FPC 1404. The antenna carrier 1402 may have dimensions of about 87.5 mm long, 3 mm wide, and 1 mm high. The antenna FPC 1404 is coupled to antenna contacts 1406, which may have spring contacts to ground the antenna FPC 1404 with the respective grounding tabs 1210 illustrated in FIG. 12. Coupled to the antenna FPC 1404 is a feed circuit 1408, to which an end of the antenna cable 812 may be coupled or soldered. The antenna cable 812 may be coupled to the WAN modem module 840. The feed circuit 1408 may be coupled to a feed contact 1410, which may be coupled to the WAN modem module 840 via conductive adhesive and/or a screw, and may provide grounding for the feed circuit 1408.

Figure 15:
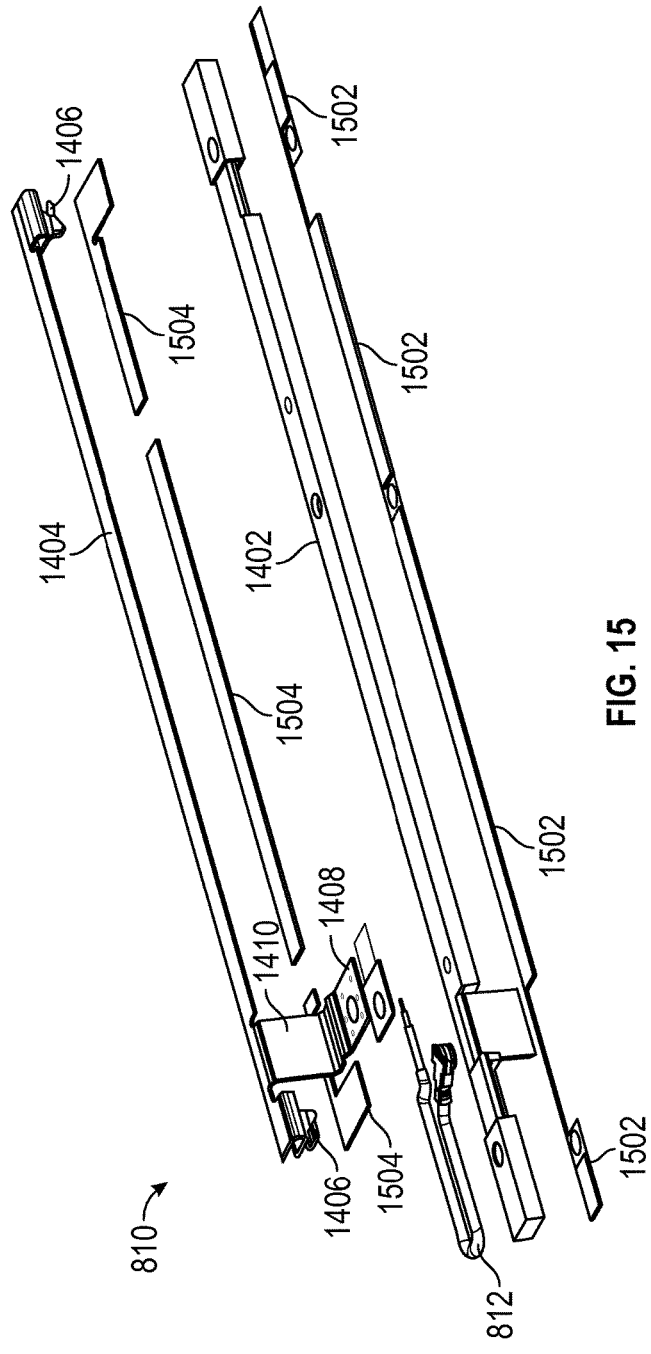
FIG. 15 illustrates an exploded view of a WAN antenna module, in accordance with embodiments of the present invention.

FIG. 15 illustrates an exploded view of a WAN antenna module 810, in accordance with embodiments of the present invention. In the embodiment shown, the antenna FPC 1404 may be coupled to the antenna carrier 1402 via one or more antenna FPC adhesives 1504. The antenna carrier 1402 may be coupled to the frame 200 via one or more antenna carrier adhesives 1502.

Figure 16:
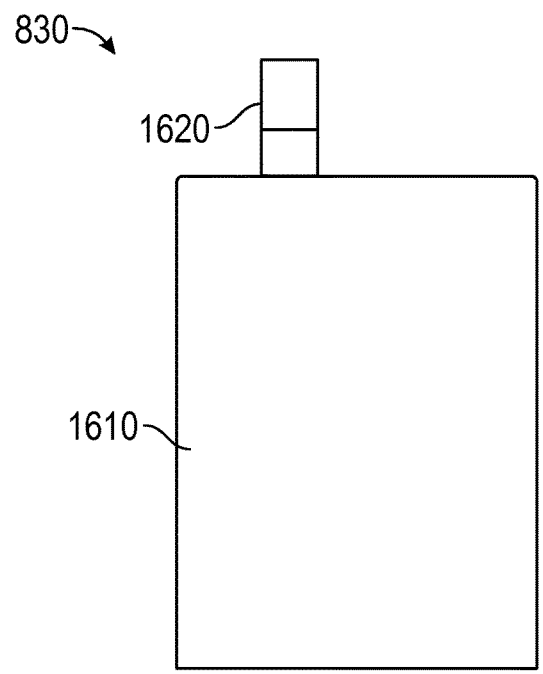
FIG. 16 illustrates a device battery module, in accordance with embodiments of the present invention.

FIG. 16 illustrates a device battery module 830, in accordance with embodiments of the present invention. The device battery module 830 may include a battery cell 1610, such as a small capacity 200 mA, high voltage 4.35 V, LiIon small cell battery that has low impedance and is light weight. The device battery module 830 may also include a battery connector 1620 that may couple to the battery socket 1312 of the mainboard module 820.

Figure 17:
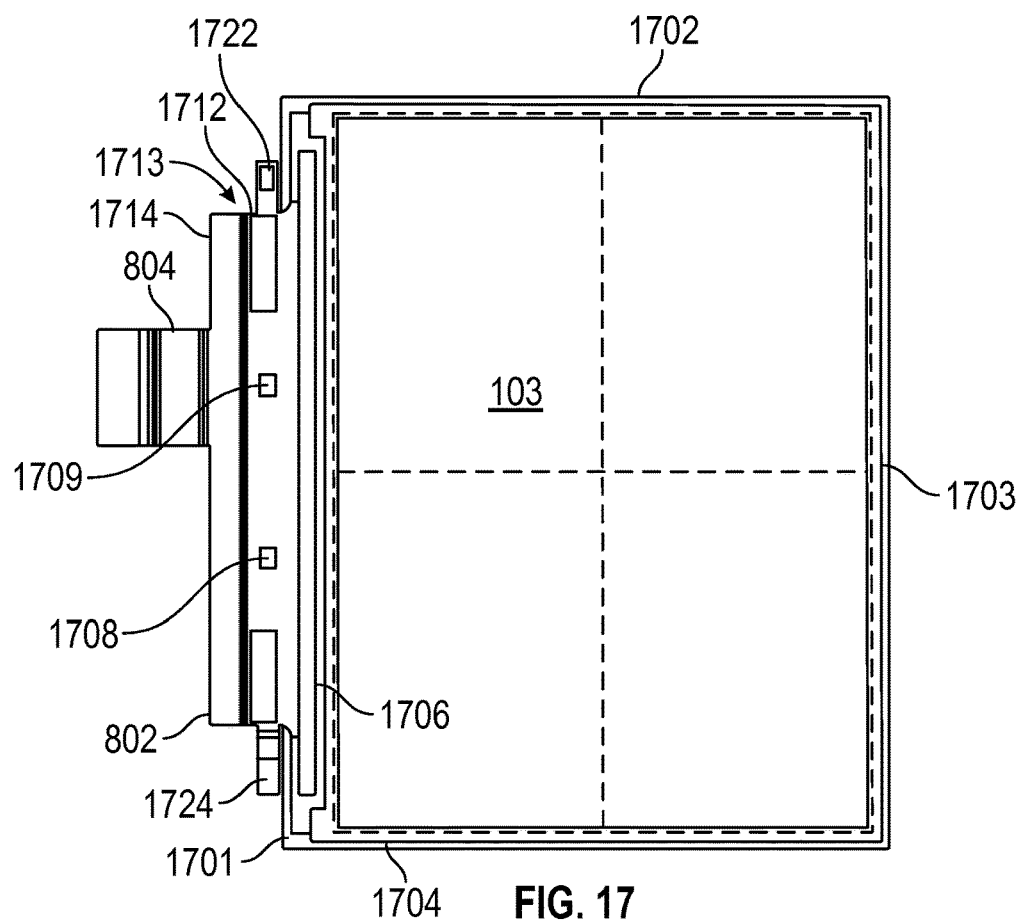
FIG. 17 illustrates a partially assembled button assembly, in accordance with embodiments of the present invention.

FIG. 17 illustrates a partially assembled button assembly 802, in accordance with embodiments of the present invention. The button assembly 802 may be adhered to a first side portion 1701 of the display assembly 103 via an adhesive 1706, such as an anisotropic conductive film (ACF). For example, if the display assembly 103 comprises a display panel, such as an electronic paper display (EPD) panel, then the adhesive 1706 may adhere the button assembly 802 to the EPD panel. The display assembly 103 may include the first side portion 1701, a second side portion 1702 adjacent the first side portion 1701, a third side portion 1703 adjacent the second side portion 1702 and opposing the first side portion 1701, and a fourth side portion 1704 adjacent the third side portion 1703, adjacent the first side portion 1701, and opposing the second side portion 1702. The button assembly 802 may comprise a first dome switch 1708 and a second dome switch 1709. In an embodiment, the first button 108 may be positioned above the first dome switch 1708, and when a user depresses the first button 108, the first dome switch 1708 may be actuated via the depression. It is to be understood that the dome switches 1708,1709 are a representative embodiment, and other suitable switch assemblies may be utilized.

The button assembly 802 may include a first display FPC portion 1712 on which the first dome switch 1708 and the second dome switch 1709 may be coupled. The button assembly may include a second display FPC portion 1714 attached to the first display FPC portion 1712 via a fold portion 1713. Under some embodiments, the second display FPC portion 1714 may fold to be proximate the first display FPC portion 1712.

Under an embodiment in which the display assembly 103 includes a touch assembly, the button assembly 802 may include a touch socket 1722 with which a touch connector of the touch assembly may couple, such as via a board-to-board coupling. Under an embodiment in which the display assembly 103 includes a front light assembly, the button assembly 802 may include a front light socket 1724 with which a front light connector of the front light assembly may couple, such as via a board-to-board coupling. Under some embodiments, the integrated display FPC 804 may be electronically coupled to the second display FPC portion 1714, the first display FPC portion 1712, the first dome switch 1708, the second dome switch 1709, the touch socket 1722, and/or the front light socket 1724.

Figure 18:
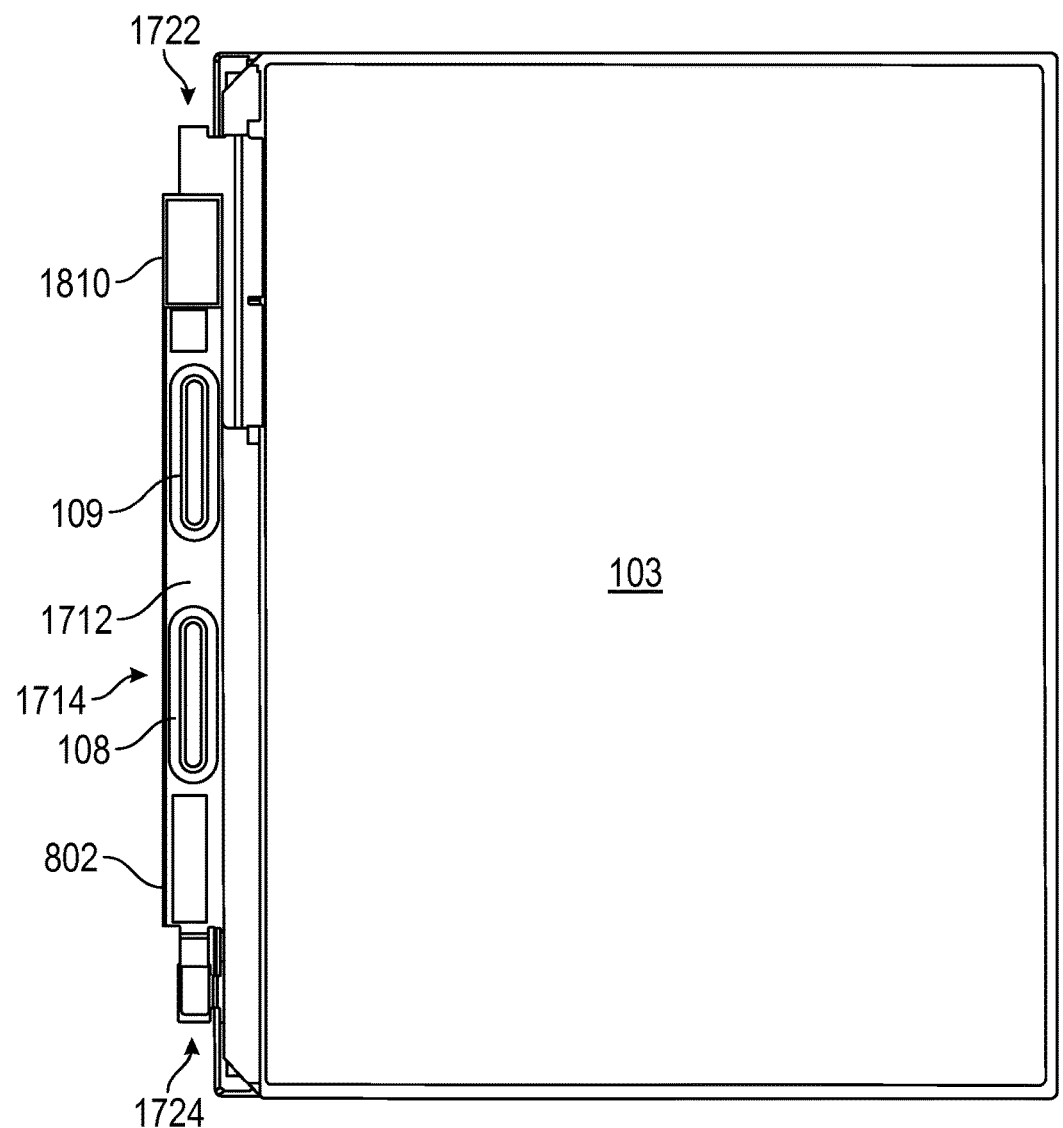
FIG. 18 illustrates a button assembly, in accordance with embodiments of the present invention.

FIG. 18 illustrates a button assembly 802, in accordance with embodiments of the present invention. As illustrated, the second display FPC portion 1714 may be folded underneath the first display FPC portion 1712. Furthermore, the touch socket 1722 may be coupled to a touch connector and the front light socket 1724 may be coupled to a front light connector. The button assembly 802 may include the first button 108 positioned proximate or above the first dome switch 1708, and may include the second button 109 positioned proximate or above the second dome switch 1709. Under some embodiments, the button assembly 802 may include a hall sensor 1810, which may be configured to detect when the lid 312 of the case 310 is positioned in a closed orientation to the cover glass 105 of the electronic device 100. Such may be advantageous to power off the electronic device 100 when the lid 312 is closed or power on the electronic device 100 when the lid 312 is open.

Figure 19:
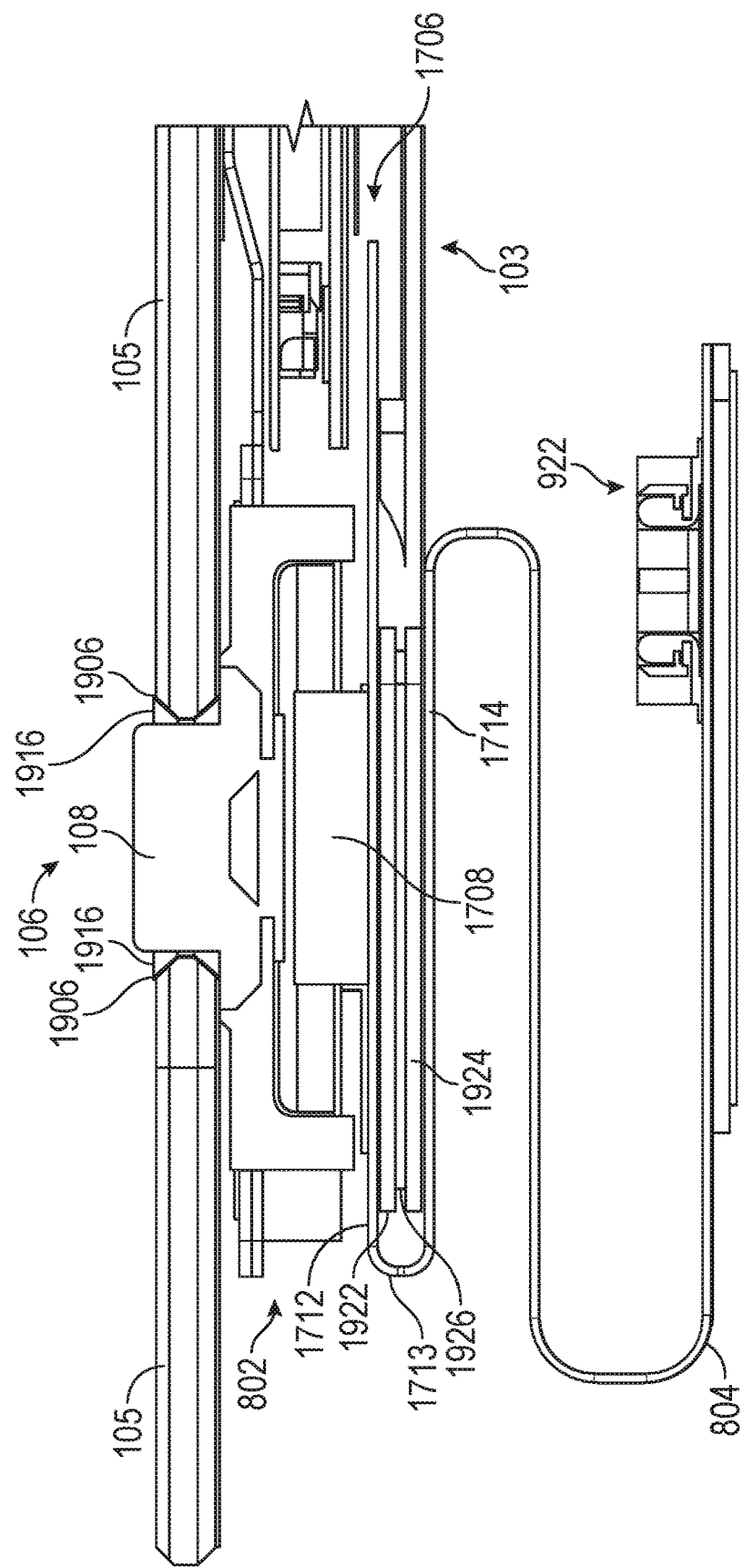
FIG. 19 illustrates a cross-sectional view of a button assembly, in accordance with embodiments of the present invention.

FIG. 19 illustrates a cross-sectional view of a button assembly 802, in accordance with embodiments of the present invention. As illustrated, the button assembly 802 may comprise the integrated display FPC 804 having an integrated display connector 922 that may couple to the integrated display socket 1316 of the mainboard module 820. The integrated display FPC 804 may also be adhered to the display assembly 103 via the adhesive 1706.

The button assembly 802 may include the first button 108 positioned within the first aperture 106 of the cover glass 105. As described below, a first aperture insert 1916 may be insert molded to the cover glass 105 within the first aperture 106, and the first aperture insert 1916 may cover a first chamfer surface 1906 of the cover glass 105. Such may be advantageous to prevent like leakage via the first chamfer surface 1906 from light of the display assembly 103.

Beneath the first button 108 may be the first dome switch 1708. The first dome switch 1708 may be coupled to the first display FPC portion 1712 and the second display FPC portion 1714 may be folded beneath the first display FPC portion 1712 via the fold portion 1713. In some embodiments, a first support structure 1922 may be adhered to the first display FPC portion 1712 with a thermally-activated adhesive or the like, and a second support structure 1924 may be coupled to the second display FPC portion 1714 with a thermally-activated adhesive or the like. The first support structure 1922 may be adhered to the second support structure 1924 with a support adhesive 1926. The support structures 1922,1924 may comprise a stainless steel material or the like, which may be advantageous to provide support for a depression of the first button 108. It is to be understood that the above description of the first button 108, the first dome switch 1708, and the first aperture 106 may also apply to the second button 109, the second dome switch 1709, and the second aperture 107.

Figure 20:
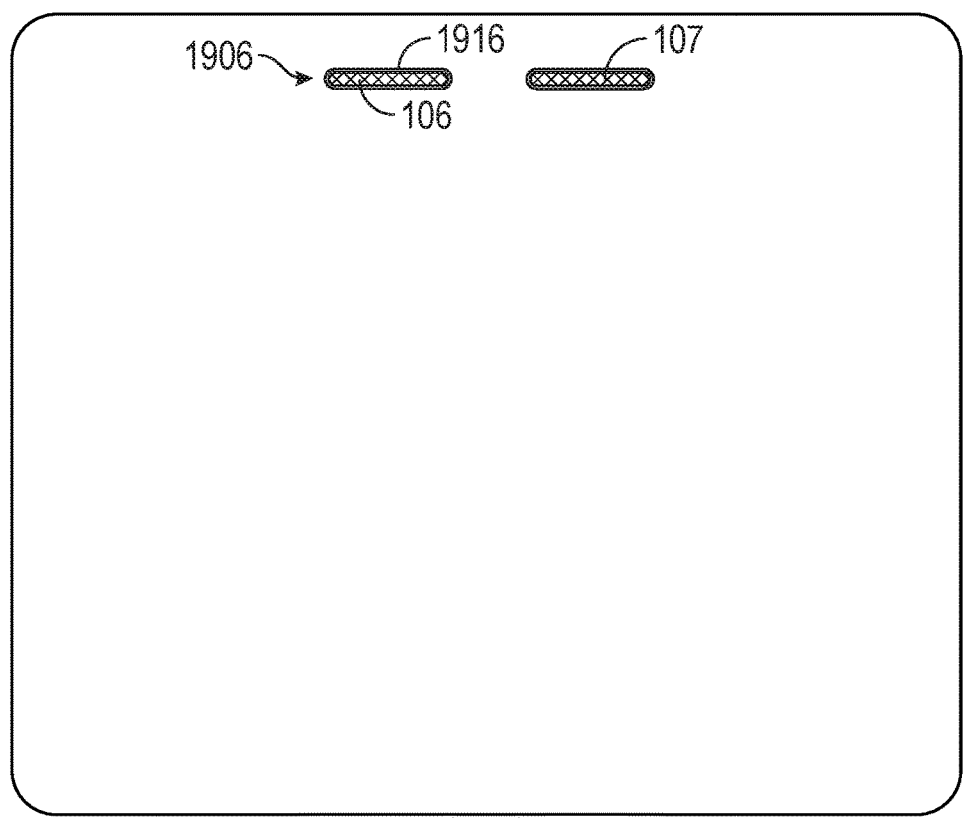
FIG. 20 illustrates a cover glass, in accordance with embodiments of the present invention.

FIG. 20 illustrates a cover glass 105, in accordance with embodiments of the present invention. The cover glass 105 may include the first aperture 106 and the second aperture 107. The cover glass 105 may also include the first chamfer surface 1906 hidden from view by the first aperture insert 1916. Under some embodiments, the first aperture insert 1916 may comprise a plastic ring deposited on at least the first chamfer surface 1906, such as with glass insert molding or other conventionally known injection molding processes. A first aperture insert 1916 may be beneficial to block light that may otherwise shine or leak from the first chamfer surface 1906.

Figure 21:
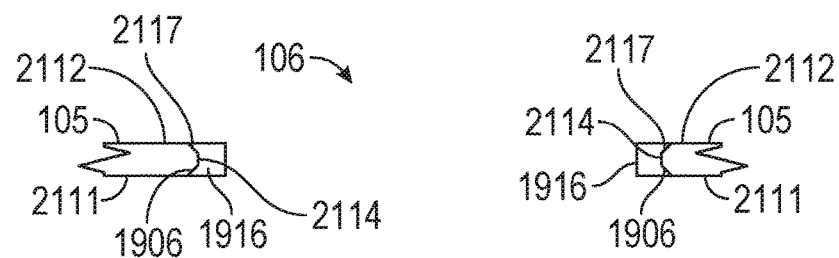
FIG. 21 illustrates a cross-sectional view of a portion of a cover glass, in accordance with embodiments of the present invention.

FIG. 21 illustrates a cross-sectional view of a portion of a cover glass 105, in accordance with embodiments of the present invention. As illustrated, the cover glass 105 may include a front surface 2111 and a back surface 2112 that opposes the front surface 2111. It is to be understood that when the cover glass is coupled to the electronic device 100, the back surface 2111 may be proximate or coupled to the display assembly 103 and the front surface 2111 may be facing the user. In some embodiments, the front surface 2111 may have a micro-texture, for example, the front surface 2111 may be micro-etched with a matted texture. Such may be advantageous to reduce reflection or glare of ambient light such as sunlight. The cover glass 105 may include the first aperture 106, and a side surface 2114 may be adjacent the aperture 106 and may be between the front surface 2111 and the back surface 2112. Under some embodiments, the cover glass 105 may include one or more chamfers or bullets, which may provide additional strength to the cover glass 105. A chamfer may have an angle with respect to the front or back surface 2111,2112 of about 45 degrees or from about 30 degrees to about 60 degrees. As illustrated in FIG. 21, the cover glass 105 may include a first chamfer surface 1906 that is between the side surface 2114 and the front surface 2111, and a second chamfer surface 2117 that is between the side surface 2114 and the back surface 2112. A chamfer or bullet may be advantageous to reduce crack nucleation of the cover glass 105.

Under some embodiments, the first aperture insert 1916 may be deposited or glass insert molded on the first chamfer surface 1906, the side surface 2114, and/or the second chamfer surface 2117 via insert molding. The first aperture insert 1916 may form an annular ring that encapsulates the surface of the aperture 106 of the cover glass 105. Under some embodiments, the first aperture insert 1916 is not deposited on the front surface 2111 of the cover glass 105, for example, the first aperture insert 1916 may not increase the thickness of the cover glass 105. For example, a suitable mold may be placed within or adjacent the first aperture, and a molten material may be injected into the mold. The molten material may be, for example, polycarbonate, acrylonitrile butadiene styrene (ABS), polyethylene terephthalate (PET), polymers such as thermoplastics, thermostats, and elastomers or the like. After the molten material solidifies, the molten material may form the first aperture insert 1916 as well as excess material that may be attached to the first aperture insert 1916. Glass insert molding may be advantageous to mold a durable material around the edge of the aperture 106, in which the durable material is resistant to wear and tear from depression of the first button 108.

For example, after an optional priming material is placed on the first chamfer surface 1906, the side surface 2114, and the second chamfer surface 2117, then the cover glass 105 may be placed within a glass insert mold. Thereafter, molten material may be injected into a glass insert mold (not shown). After the molten material solidifies into solidified material, the excess solidified material associated with the components of the glass insert mold may be removed via a computer numerical control (CNC) machine or the like. Under some embodiments, the excess solidified material may connect with a portion of the first aperture insert 1916 proximate the back surface 2112 of the cover glass 105, which may be advantageous as a step, mark, blemish, or defect caused by the CNC machine may not be visible to a user of the electronic device 100 when the front surface 2111 is facing the user.

The first aperture insert 1916 may be advantageous to reduce the amount of light that may shine or leak via the first chamfer surface 1906 absent the first aperture insert 1916. It is to be understood that alternative material may be deposited on the first chamfer surface 1906 via a variety of deposit methods or procedures. For example, ink may be applied via a nib of a marker or ink may be micro-sprayed or brushed onto the surface. Under some embodiments, the first chamfer surface 1906 may be dipped into a material after other surfaces have been covered, masked or sputtered. Excess material may be removed after dipping via conventional means such as chemical etching, laser etching, or the like. Furthermore, an alternative material for deposit on the first chamfer surface 1906 may be epoxy. It is to be understood that although FIG. 21 illustrates the first aperture insert 1916 in relation to the first aperture 106, FIG. 21 is also applicable to a second aperture insert in relation to the second aperture 107 of the cover glass 105.

Figure 22:
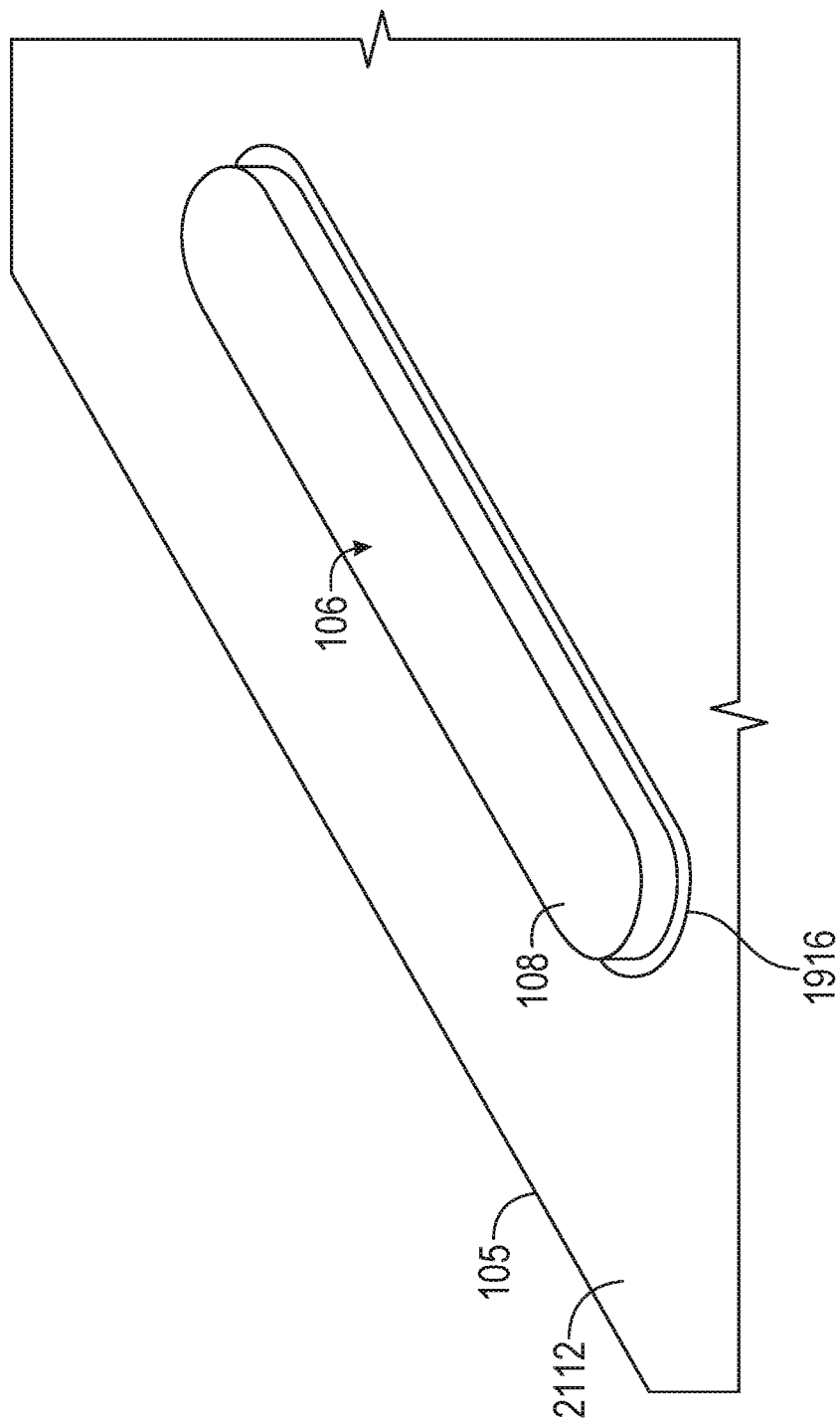
FIG. 22 illustrates a perspective view of a portion of a cover glass, in accordance with embodiments of the present invention.

FIG. 22 illustrates a perspective view of a portion of a cover glass 105, in accordance with embodiments of the present invention. The cover glass 105 is shown with the back surface 2112 facing up. The cover glass 105 includes the first aperture 106, the first aperture insert 1916, and the first button 108, which may be inserted within the first aperture 106.

FIG. 23 illustrates a bottom side view of a case 310, in accordance with embodiments of the present invention. FIG. 24 illustrates a hinge side view of a case 310, in accordance with embodiments of the present invention. FIG. 25 illustrates a back view of a case 310, in accordance with embodiments of the present invention. FIG. 26 illustrates a front view of a case 310, in accordance with embodiments of the present invention. The case 310 includes the lid 312, the hinge 316 coupled to the lid 312, and the auxiliary portion 314 coupled to the hinge 316. As illustrated in FIG. 23, the case 310 may include a case connector module 2310 or a second connector module, which may be located proximate the sloping end 320. As illustrated in FIG. 25, the auxiliary portion 314 may be sized to accommodate the thick portion 204 of the electronic device 100, when the case 310 is coupled to the electronic device 100. The lid 312 may have dimensions of about 140.36 mm by about 119.6 mm, and the auxiliary portion 314 may have dimensions of about 140.36 mm by about 82.8 mm. The weight of the case may be about 100.8 grams.

Figure 27:
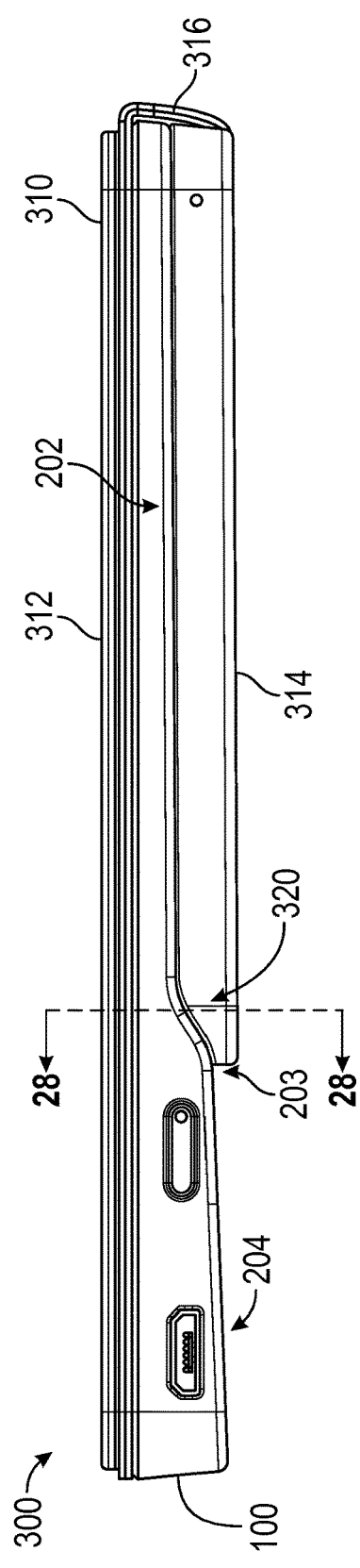
FIG. 27 illustrates a top side view of a system, in accordance with embodiments of the present invention.

FIG. 27 illustrates a top side view of a system 300, in accordance with embodiments of the present invention. The system 300 may include the electronic device 100 docked with the case 310. As illustrated, the thin portion 202 of the frame 200 of the electronic device 100 may be configured to fit between the lid 312 and the auxiliary portion 314 of the case 310. Furthermore, the transition portion 203 of the electronic device 100 may fit against the sloping end 320 of the auxiliary portion 314. Such may accommodate an interface between the device connector module 210 and the case connector module 2310.

Figure 28:
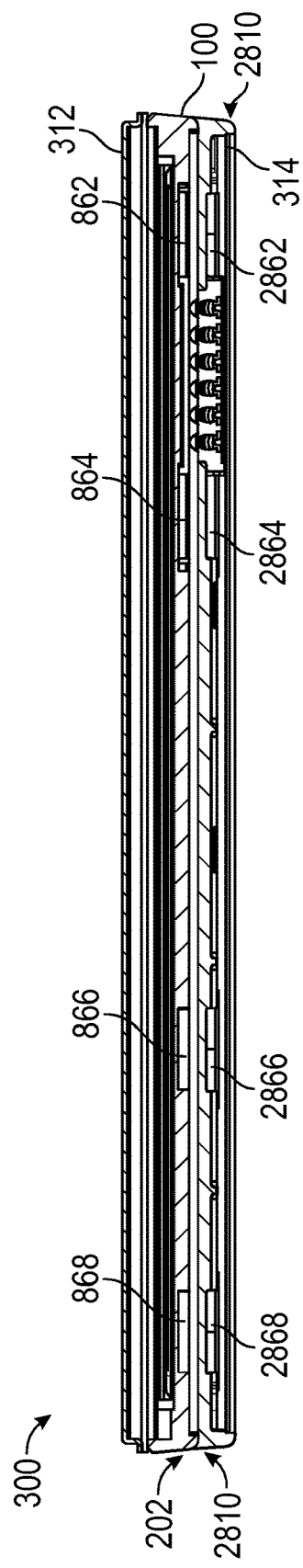
FIG. 28 illustrates a cross-sectional view of a system, in accordance with embodiments of the present invention.

FIG. 28 illustrates a cross-sectional view of a system 300 at line 28-28 of the embodiment of FIG. 27, in accordance with embodiments of the present invention. The auxiliary portion 314 may comprise a first case magnet 2862 that aligns with the first device magnet 862, a second case magnet 2864 that aligns with the second device magnet 864, a third case magnet 2866 that aligns with the third device magnet 2866, and a fourth case magnet 2868 that aligns with the fourth device magnet 2868. In some embodiments, the magnets may include a magnetic flux plate which may assist the case 310 to align into position in relation to the electronic device 100 due to the polarity of the magnets, which may enhance the sheer force and strength.

As illustrated, one or more alignment portions 2810 or ridges of the auxiliary portion 314 may aid in alignment of the thin portion 202 into position or may provide guidance of the thin portion 202 into position with the auxiliary portion 314. The alignment portion 2810 may also provide a smooth exterior surface transition between the auxiliary portion 314 and the thin portion 202, providing the appearance of a continuous surface between the electronic device 100 and the case 310 such that the case 310 appears to be an extension of the electronic device 100.

Figure 29:
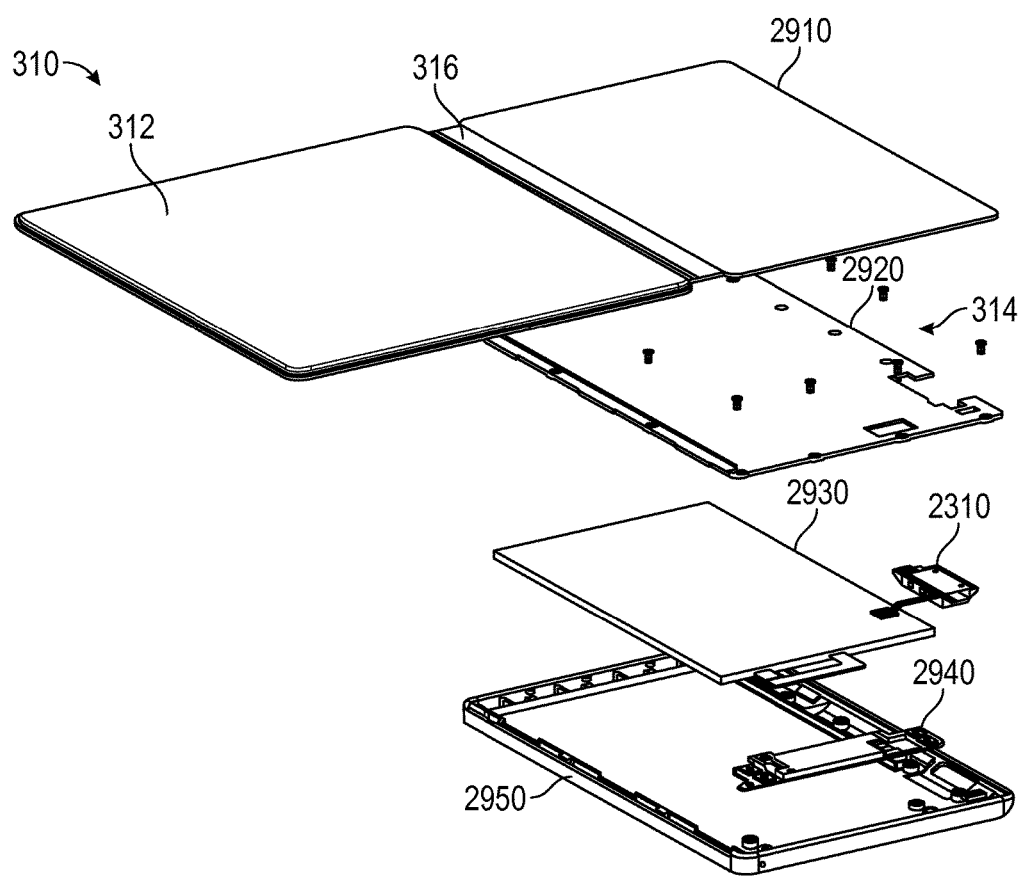
FIG. 29 illustrates an exploded view of a case, in accordance with embodiments of the present invention.

FIG. 29 illustrates an exploded view of a case 310, in accordance with embodiments of the present invention. As illustrated, the case 310 may have the lid 312, the hinge 316, and the auxiliary portion 314. The auxiliary portion 314 may comprise a cavity assembly 2950 configured to carry the case connector module 2310, a case PCB 2940, and a case battery module 2930, which may be retained within the cavity assembly 2950 by an auxiliary portion plate 2920 that may couple to the cavity assembly 2950. The cavity assembly 2950 may in turn be coupled to a flap assembly 2910. The case battery module 2930 may include a battery cell, such as a high capacity 1100 mA battery or 1240 mA battery, and a battery connector that may couple to a battery socket of the case PCB 2940. It is to be understood that the capacity of the battery may depend on the thickness or size of the cavity assembly 2950, and may have a range, for example, of 1000 mA to 1500 mA.

Figure 30:
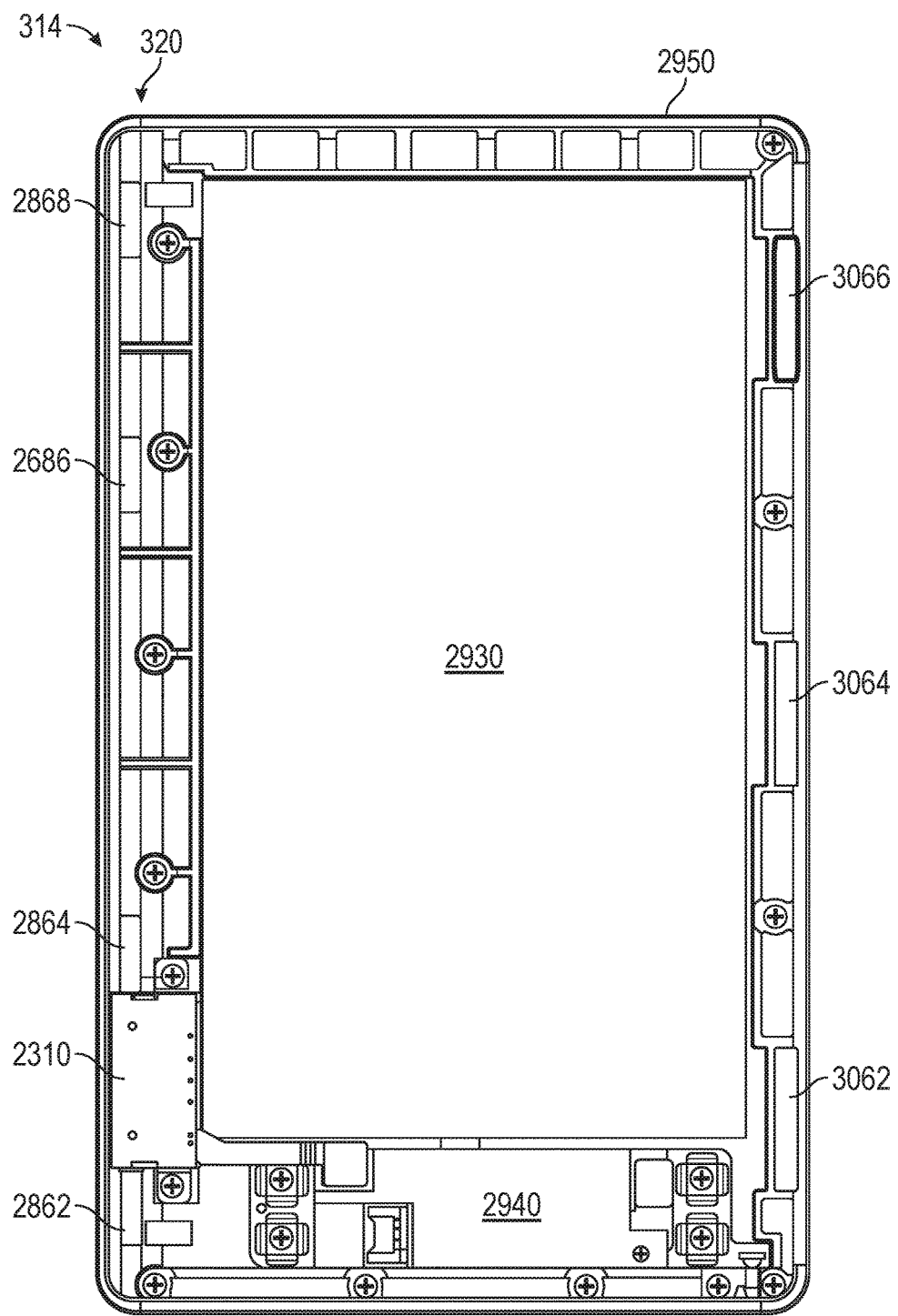
FIG. 30 illustrates a partially assembled auxiliary portion of a case, in accordance with embodiments of the present invention.

FIG. 30 illustrates a partially assembled auxiliary portion 314 of a case 310, in accordance with embodiments of the present invention. The auxiliary portion 314 may include the case battery module 2930, the case PCB 2940, the case connector module 2310, and the cavity assembly 2950. As discussed above, the auxiliary portion 314 may include the first case magnet 2862 that aligns with the first device magnet 862, the second case magnet 2864 that aligns with the second device magnet 864, the third case magnet 2866 that aligns with the third device magnet 2866, and the fourth case magnet 2868 that aligns with the fourth device magnet 2868. In some embodiments, these case magnets 2862, 2864, 2866, 2868 may be positioned proximate the sloping end 320 of the auxiliary portion 314. Furthermore as shown, the first case magnet 2862 may be adjacent the case connector module 2310, and the second case magnet 2864 may be adjacent and positioned at an opposing side of the case connector module 2310. Such may be advantageous to improve the magnetic coupling of the case connector module 2310 with the device connector module 210 of the electronic device 100.

The auxiliary portion 314 may also include additional magnets on an opposing side to the first, second, third, and fourth case magnets 2862, 2864, 2866, 2866. As shown, the auxiliary portion 314 may include a fifth case magnet 3062 that aligns with the fifth device magnet 962, a sixth case magnet 3064 that aligns with the sixth device magnet 964, and a seventh case magnet 3066 that aligns with the seventh device magnet 966. The placement of the device magnets 3062,3064,3066 may be placed proximate to the hinge 316, which may be advantageous to keep the case 310 magnetically coupled to the electronic device 100 when a user rotates the lid 312 around the hinge 316. In some embodiments, it may be advantageous for there to be no magnets on the side of the auxiliary portion 314 that corresponds to the placement of the WAN antenna module 810 of the electronic device 100 and the corresponding antenna window. It is to be understood that, although seven magnets are depicted in FIG. 30, the number of magnets for the auxiliary portion 314 and the corresponding number of magnets for the frame 200 is not meant to be limiting.

Figure 31:
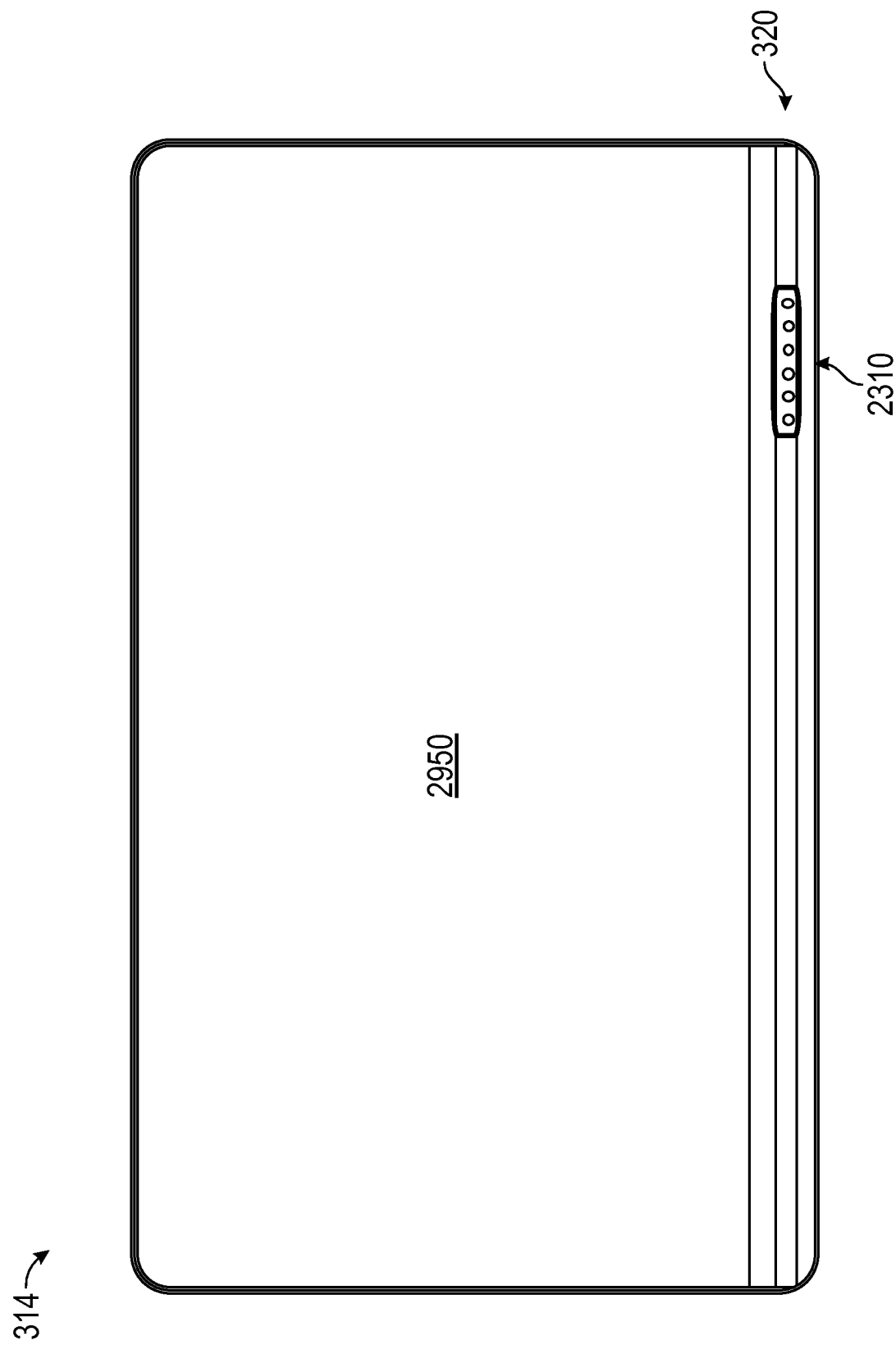
FIG. 31 illustrates an auxiliary portion of a case, in accordance with embodiments of the present invention.

FIG. 31 illustrates an auxiliary portion 314 of a case 310, in accordance with embodiments of the present invention. As illustrated, the auxiliary portion 314 may include the cavity assembly 2950 having an aperture configured for the case connector module 2310. In some embodiments, the aperture is located on the sloping end 320 of the auxiliary portion 314, so that an interface may be formed between the case connector module 2310 and the device connector module 210.

Figure 32:
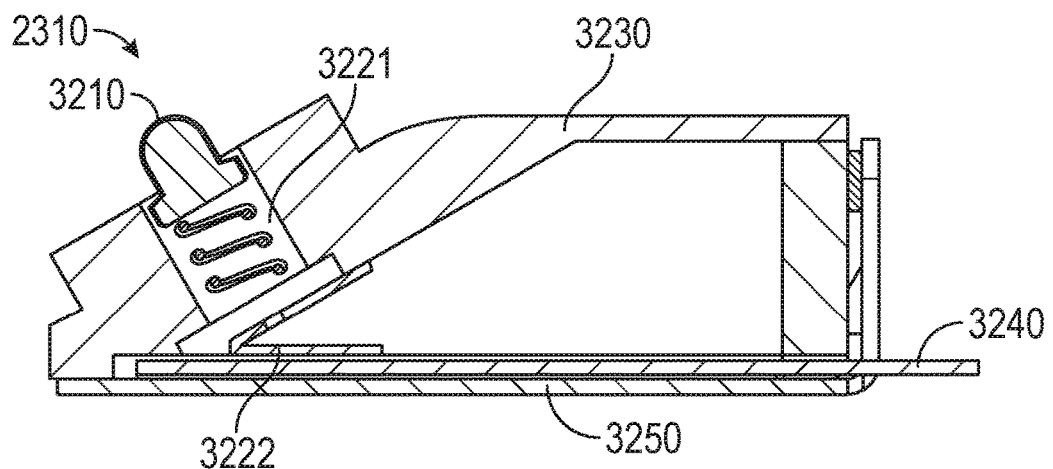
FIG. 32 illustrates a cross-sectional view of a case connector module, in accordance with embodiments of the present invention.

FIG. 32 illustrates a cross-sectional view of a case connector module 2310, in accordance with embodiments of the present invention. The case connector module 2310 may include at least one pin 3210, such as a spring loaded pin having a pin spring 3221 or the like to cause the pin 3210 to remain in connection with a corresponding contact. The pin 3210 may be coupled to a pin connector 3222, and the pin connector 3222 may be coupled to a connector PCB 3240. The pin 3210 may be carried within a connector housing 3230 that may be coupled to the connector PCB 3240 and a connector plate 3250, which may be coupled to the cavity assembly 2950.

Figure 33:
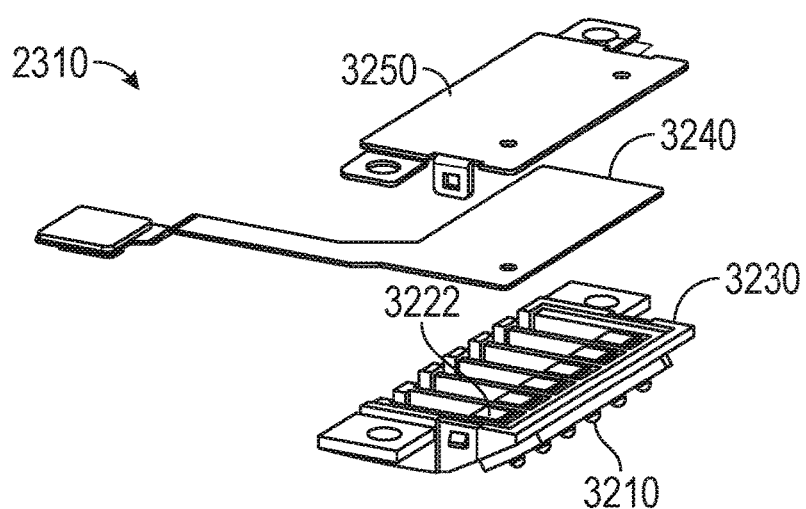
FIG. 33 illustrates an exploded view of a case connector module, in accordance with embodiments of the present invention.

FIG. 33 illustrates an exploded view of a case connector module 2310, in accordance with embodiments of the present invention. The case connector module 2310 may include the connector plate 3250, the connector PCB 3240, and the connector housing 3230. As illustrated, the case connector module 2310 may include six pins 3210 and six corresponding pin connectors 3222. It is to be understood that the number of pins 3210 is not meant to be limiting. For example, the case connector module 2310 may include five pins that correspond to the number of pins for a micro-USB port. Under some embodiments, a sixth or extra pin 3210 of the case 310 or contact 610 of the electronic device 100 may be an identifier pin 3210 or contact 610 that may assist in assuring that an unauthorized device is not accidentally connecting with the device connector module 210 or the case connector module 2310. Under some embodiments, a pin 3210 may electronically couple or interface with the corresponding contact 610 of the device connector module 210 of the electronic device 100.

FIG. 34 illustrates a cross-sectional view of a portion of a case 310, in accordance with embodiments of the present invention. The case 310 illustrated in FIG. 34 shows the lid 312 and the flap assembly 2910, in which other components of the auxiliary portion 314 are not shown.

FIG. 35 illustrates a cross-sectional view of a portion of a lid 312 of a case 310 at circle 35 of the embodiment of FIG. 34, in accordance with embodiments of the present invention. As shown, the lid 312 may have an exterior surface comprising, for example, a leather layer 3501 or the like and an interior surface comprising, for example, a microfiber layer 3505 or the like. It is to be understood that the terms exterior and interior surfaces may be in relation to the electronic device 100 that is docked to the case 310 in a closed position, such that the interior surface is proximate the cover glass 105 and the exterior surface is opposing the interior surface. Between the exterior surface and the interior surface may be a first fiber glass layer 3502, a foam layer 3503, and a second fiber glass layer 3504. The fiber glass layers 3502,3504 may be strong in tension, and the foam layer 1503 may be strong in compression yet light in weight. Such an example lightweight and rigid structure with combined strength in tension and compression may provide an improved moment of inertia of the lid 312 as it rotates around the hinge 316 of the case 300. The foam layer 1503 may be advantageous to provide impact protection of the cover glass 105. Under some embodiments, the layers may be bonded together with pressure-sensitive adhesive (PSA).

Under some embodiments, the leather layer 3501 may be about 0.6 mm thick, the first fiber glass layer may be about 0.2 mm thick, the foam layer 3503 may be about 1.2 mm thick, the second fiber glass layer 3504 may be about 0.2 mm thick, and the microfiber layer 3505 may be about 0.5 mm thick. Examples of a foam layer 1503 are model number 110-S from Evonik Industries AG of Essen, Germany.

FIG. 36 illustrates a cross-sectional view of a portion of a flap assembly 2910 of an auxiliary portion 314 of a case 310 at circle 36 of the embodiment of FIG. 34, in accordance with embodiments of the present invention. As shown, the flap assembly 2910 may have an exterior surface comprising, for example, a leather layer 3601 or the like and a first interior surface comprising, for example, a microfiber layer 3604. It is to be understood that the terms exterior and interior surfaces may be in relation to the electronic device 100 that is docked to the case 310, such that the interior surface is proximate the frame 200 and the exterior surface is opposing the interior surface. In some embodiments, the microfiber layer 3604 may be an extension of the microfiber layer 3505 depicted in FIG. 35, and the leather layer 3601 may be an extension of the leather layer 3501 depicted in FIG. 35.

As shown, beneath the leather layer 3601 may be a polycarbonate (PC) layer 3602. Such may be advantageous to provide a flat surface for bonding of the leather layer 3601 and to prevent or hide witness marks of the leather layer 3601 due to screws or the like applied to the auxiliary portion plate 2920. Beneath the PC layer 3602 may be a heat sensitive adhesive (HSA) layer 3603, which may bond the cavity assembly 2950 to the flap assembly 2910. In some embodiments, the microfiber layer 3604 may extend no further than to the cavity assembly 2950. In some embodiments, a portion of the flap assembly 210 may have an adhesive layer 3605 beneath a portion of the microfiber layer 3601. Such an adhesive layer 3605 may comprise an HSA, which may further adhere the flap assembly 2910 to the cavity assembly 2950 at or proximate to the hinge 316.

Under some embodiments, the leather layer 3601 may be about 0.6 mm thick, the PC layer 3602 may be about 0.25 mm thick, the HSA layer 3603 may be about 0.05 mm thick, and the microfiber layer 3604 may be about 0.5 mm thick.

Figure 37:
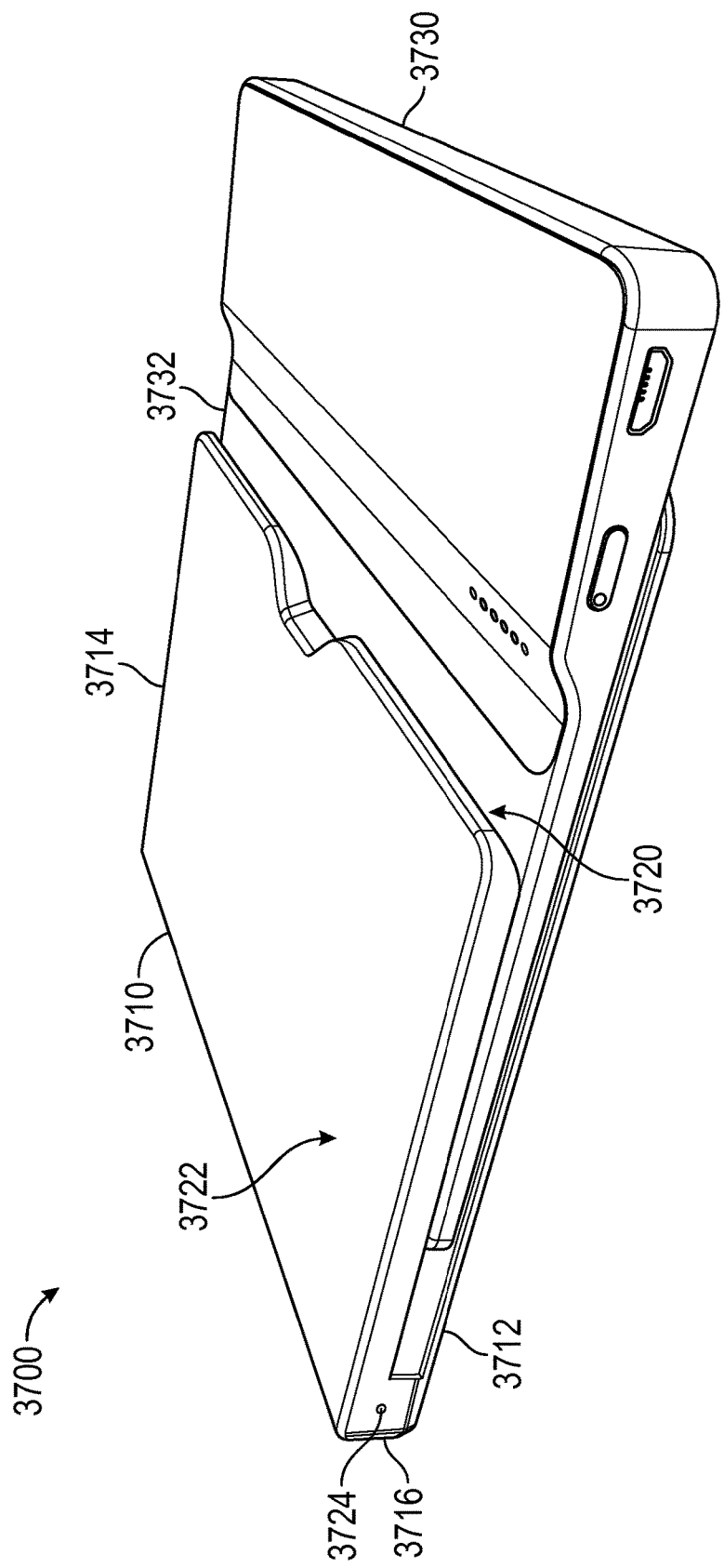
FIG. 37 illustrates a perspective back view of a first alternative system, in accordance with embodiments of the present invention.

FIG. 37 illustrates a perspective back view of a first alternative system 3700, in accordance with embodiments of the present invention. The first alternative system 3700 may include a first alternative electronic device 3730, which may be similar to or the same as the electronic device 100 described above, and a first alternative case 3710. The first alternative case 3710, may comprise a lid 3712, an auxiliary portion 3714, and a bridge 3716 coupled with the lid 3712 and the auxiliary portion 3714. The bridge 3716 may comprise a rigid material such that the first alternative case 3710 may be configured to have a rigid C-shape forming a slot within which a thin portion 3732 of the first alternative electronic device 3730 may reside. For example, a user may slide the thin portion 3732 into the slot of the first alternative case 3710. The first alternative case 3710 may have many of the same components described for the case 310 above, such as a case connector module 3720, a case battery module 3722, or a case indicator 3724. The first alternative case 3710 may also include various magnets to aid in coupling the first alternative electronic device 3730 with the first alternative case 3710. The first alternative system 3700 may be advantageous because the case battery module 3722 may be utilized to charge a device battery module of the first alternative electronic device 3730 when docked to the first alternative case 3710. In addition, because the lid 3712 may be restricted in position due to the rigidity of the bridge 3716, a user may remove the first alternative case 3710 in order to view a display assembly of the first alternative electronic device 3730. Such may be advantageous because the user will be aided in holding just the first alternative electronic device 3730 when, for example, reading an electronic book without the additional weight or volume of the first alternative case 3710.

Figure 38:
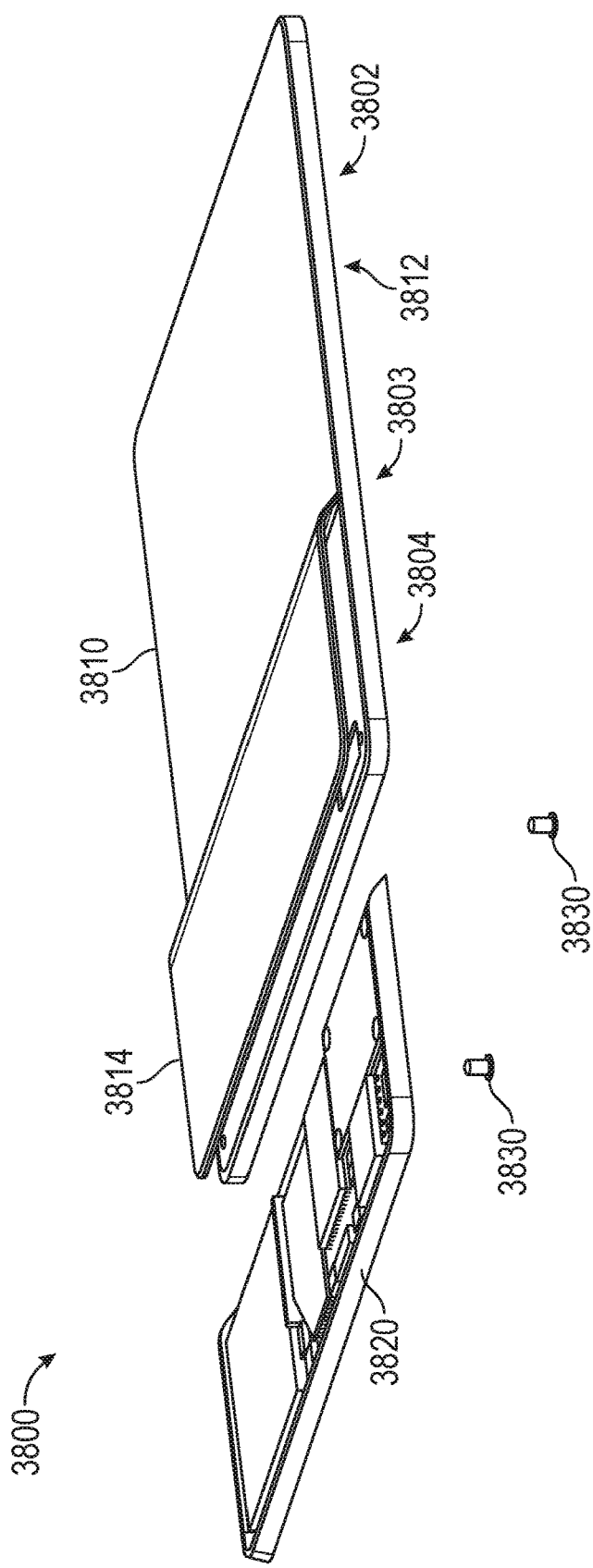
FIG. 38 illustrates an exploded back view of a second alternative electronic device, in accordance with embodiments of the present invention.

FIG. 38 illustrates an exploded back view of a second alternative electronic device 3800, in accordance with embodiments of the present invention. The second alternative electronic device 3800 may have a thin portion 3802, a thick portion 3804, and a transition portion 3803 between the thin portion 3802 and the thick portion 3804. The second alternative electronic device 3800 may include a tray 3820 that couples with a frame 3810, which may include components such as a display assembly 3812. The tray 3820 may comprise a sheet metal material with a plastic over-mold, and may carry or include components such as a battery module, a mainboard module, and a device connector module. The frame 3810 may include a tray cover portion 3814 that may cover components carried by the tray 3820, when the tray 3820 may be inserted between the tray support cover 3814 and the frame 3810. The tray 3820 may be fixed to the frame 3810 with one or more screws 3830 or the like. The second alternative electronic device 3800 may be advantageous due to the ease with which the second alternative electronic device 3800 may be assembled.

Figure 39:
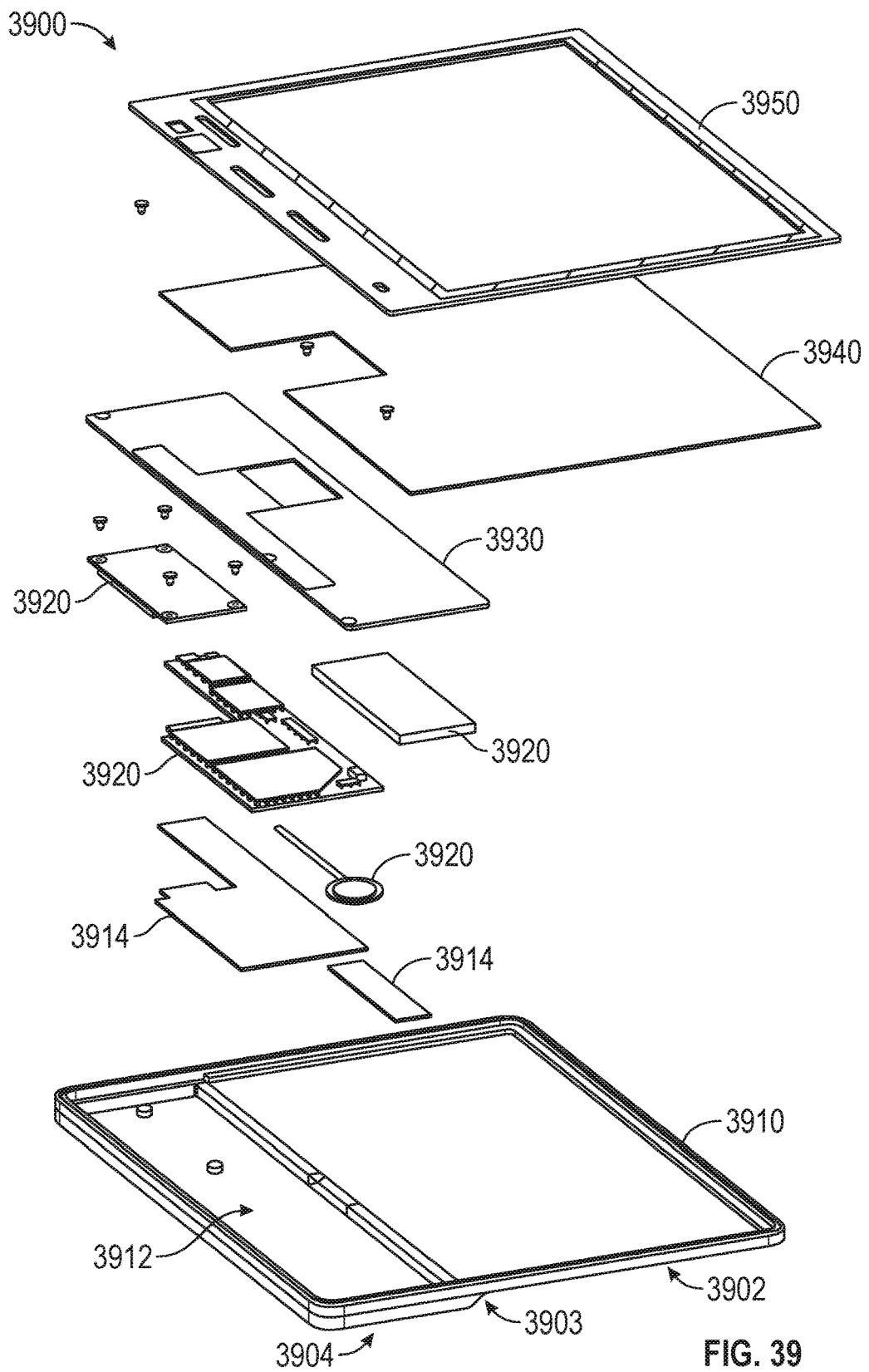
FIG. 39 illustrates an exploded front view of a third alternative electronic device, in accordance with embodiments of the present invention.

FIG. 39 illustrates an exploded front view of a third alternative electronic device 3900, in accordance with embodiments of the present invention. The third alternative electronic device 3900 may have a thin portion 3902, a thick portion 3904, and a transition portion 3803 between the thin portion 3802 and the thick portion 3804. The third alternative electronic device 3900 may include a frame 3910 comprising a magnesium die-cast material or the like and may include a grip recess region 3912, which may carry various components 3920. In some embodiments, the grip recess region 3912 may have a width that is less than half the total width of the frame 3910. Some of the components may be adhered to a portion of the frame 3910 represented by the grip recess region 3912 with one or more component adhesives 3914. The third alternative electronic device 3900 may have a structural plate 3930 that may cover the components 3920 residing in the grip recess region 3912. The third alternative electronic device 3900 may include a display assembly 3950 that may be adhered to the frame 3910 and the structural plate 3930 via a display adhesive 3940.

Embodiments of the present invention may provide various advantages not provided by prior art systems. An exemplary advantage of some disclosed embodiments of an electronic device may be that one side of a backplane may support an EPD, which may decrease the EPD's susceptibility to damage or cracking. The other side of the backplane may provide a reduced area covered by a removable grip cap for assembly or reworking of certain components, such as a main logic board, a WAN module, and a battery, which may decrease the cost of manufacturing or repair of the electronic device. A further exemplary advantage is that, when the screen orientation of the EPD of the electronic device is rotated, a user can grip the electronic device with either the left or the right hand, such that the thickest and heaviest portion of the electronic device is conveniently within the grip area, which may enhance the reading experience for the user.

While the invention has been described in terms of particular embodiments and illustrative figures, those of ordinary skill in the art will recognize that the invention is not limited to the embodiments or figures described. Many of the embodiments described above in relation to the case battery module 2930 provided in the auxiliary portion 314 of the case 310 may be applied to other electronic components. For example, the WAN antenna module 810 and the WAN modem module 840 may be provided in the auxiliary portion 314 of the case 310. Such may be advantageous to reduce the weight of the electronic device 100 when undocked from the case 310, while providing the electronic device 100 the capability to interface with a WAN when the electronic device 100 is docked with the case 310.

Although various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those of ordinary skill in the art and, consequently, are not described in detail herein. If embodied in software, each block or step may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processing component in a computer system. If embodied in hardware, each block may represent a circuit or a number of interconnected circuits to implement the specified logical function(s).

Although the processes, flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

Also, any logic or application described herein that comprises software or code can be embodied in any non-transitory computer-readable medium for use by or in connection with an instruction execution system such as a processing component in a computer system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable media include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

What is claimed is:

1. A modular system, comprising:
   an electronic device comprising:
      a frame, the frame comprising:
         a first portion having a first thickness;
         a second portion having a second thickness, wherein the second thickness is greater than the first thickness,
         an inner wall having a front side and a back side;
         a display recess region adjacent the front side of the inner wall; and
         a grip recess region adjacent a first section of the back side of the inner wall, wherein the grip recess region is disposed in the second portion;
      a display assembly provided in the display recess region;
      a device battery module, a device connector module, and a logic circuit provided in the grip recess region, wherein the device battery module is disposed adjacent the first section of the back side of the inner wall opposite of the display assembly, wherein the device connector module is coupled to the device battery module; and
   a case comprising:
      an auxiliary portion configured to magnetically couple to the first portion of the frame, wherein the auxiliary portion comprises:
         a case battery module; and
         a case connector module coupled to the case battery module, wherein the case connector module is configured to electronically couple with the device connector module; and
         a moveable lid coupled to the auxiliary portion and configured to cover a front surface of the electronic device.

2. The modular system of claim 1, wherein the electronic device further comprises:
   a cover glass coupled to a front surface of the display assembly, wherein the cover glass extends over the first portion and the second portion, wherein the cover glass comprises a first aperture and a second aperture, wherein each aperture is positioned laterally adjacent to the display assembly, wherein the first aperture is positioned longitudinally adjacent to the second aperture;
   a first button positioned within the first aperture; and
   a second button positioned within the second aperture.

3. A system, comprising:
   an electronic device comprising:
      a frame, the frame comprising:
         a first portion having a first thickness;
         a second portion having a second thickness, wherein the second thickness is greater than the first thickness,
         an inner wall having a front side and a back side;
         a first recess region adjacent the front side of the inner wall; and
         a second recess region adjacent a first section of the back side of the inner wall, wherein the second recess region is disposed in the second portion;
      a display assembly provided in the first recess region adjacent the front side of the inner wall;
      a first battery module provided in the second recess region, wherein the first battery module is disposed adjacent the first section of the back side of the inner wall opposite of the display assembly;
      a cover glass coupled to a front surface of the display assembly extending over the first portion and the second portion, wherein a portion of the cover glass extending over the second portion comprises a first aperture and a second aperture, wherein each aperture is positioned laterally adjacent to the display assembly and the first aperture is positioned longitudinally adjacent to the second aperture;
      a first button positioned within the first aperture; and
      a second button positioned within the second aperture.

4. The system of claim 3, further comprising:
   a case comprising an auxiliary portion arranged so as to fit along the first portion of the frame and along a transition portion of the frame between the first portion and the second portion of the frame, wherein the auxiliary portion comprises:
      a second battery module; and
      a connector module coupled to the second battery module, wherein the connector module is configured to electronically couple with the first battery module.

5. The system of claim 3, wherein the electronic device further comprises a multichip module having a processor and a memory, wherein the multichip module is provided in the second recess region.

6. The system of claim 3, wherein the electronic device further comprises a wireless local area network (WLAN) antenna provided in the second recess region.

7. The system of claim 6, wherein the electronic device further comprises a wide area network (WAN) antenna module having an antenna flexible printed circuit provided in the first recess region and having an antenna cable provided in the second recess region, wherein the WAN antenna module and the WLAN antenna share an antenna window comprising nonconductive material.

8. The system of claim 4, wherein the connector module is configured to electronically couple with the first battery module via a magnetic coupling of the auxiliary portion of the case and the first portion of the frame of the electronic device.

9. The system of claim 8, wherein the system further comprises:
 a first magnet of the frame provided in the transition portion and adjacent to the first battery module; and
 a second magnet of the case adjacent to the connector module, wherein the second magnet is positioned to align with the first magnet, wherein at least one contact of the connector module is positioned to align with a second connector module provided in the transition portion of the frame.

10. The system of claim 3, wherein the electronic device further comprises an integrated display flexible printed circuit (FPC) coupled to the display assembly, wherein the integrated display FPC comprises a first dome switch positioned beneath the first button, wherein the first button is adhered to the integrated display FPC.

11. The system of claim 3, wherein:
 the first aperture comprises a chamfer surface; and
 the cover glass further comprises an opaque material deposited on the chamfer surface, wherein the opaque material comprises a plastic insert molding material.

12. The system of claim 3, wherein:
 a surface of the first recess region comprises a metal plating that plates a plastic material of the frame; and
 the metal plating comprises a nanocrystalline nickel material.

13. The system of claim 3, wherein the electronic device further comprises a removable cap configured to couple with the frame to enclose the second recess region.

14. The system of claim 4, wherein the case further comprises a lid coupled to the auxiliary portion, wherein the lid comprises a first fiber glass layer, a second fiber glass layer, a foam layer between the first fiber glass layer and the second fiber glass layer, a leather layer adhered to the first fiber glass layer, and a microfiber layer adhered to the second fiber glass layer.

15. The system of claim 4, wherein the auxiliary portion further comprises an alignment portion configured to align the first portion of the electronic device with the auxiliary portion of the case.

16. An electronic device, comprising:
 a frame, the frame comprising:
  a first portion having a first thickness
  a second portion having a second thickness, wherein the second thickness is greater than the first thickness;
  an inner wall having a front side and a back side;
  a first recess region adjacent the front side of the inner wall; and
  a second recess region adjacent a first section of the back side of the inner wall, wherein the second recess region is disposed in the second portion;
 a display assembly provided in the first recess region, the display assembly positioned in both the first portion and the second portion of the frame;
 a battery module positioned in the second portion of the frame, wherein the battery module is disposed adjacent to the first section of the back side of the inner wall opposite of the display assembly; and
 a cover glass coupled to a front surface of the display assembly extending over the first portion and the second portion, wherein a portion of the cover glass extending over the second portion comprises an aperture, and wherein the frame comprises a transition portion between the first portion and the second portion and a connector module coupled to the battery module is provided in the transition portion.

17. The electronic device of claim 16, further comprising a first magnet positioned in the frame adjacent to the connector module.

18. The electronic device of claim 16, further comprising:
 a control button positioned within the aperture, wherein the aperture is positioned laterally adjacent to the display assembly.

* * * * *